(12) United States Patent
Millward

(10) Patent No.: US 8,785,559 B2
(45) Date of Patent: Jul. 22, 2014

(54) CROSSLINKABLE GRAFT POLYMER NON-PREFERENTIALLY WETTED BY POLYSTYRENE AND POLYETHYLENE OXIDE

(71) Applicant: Micron Technology, Inc., Boise, ID (US)

(72) Inventor: Dan B. Millward, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/934,676

(22) Filed: Jul. 3, 2013

(65) Prior Publication Data

US 2013/0295323 A1 Nov. 7, 2013

Related U.S. Application Data

(62) Division of application No. 13/615,203, filed on Sep. 13, 2012, now Pat. No. 8,513,359, which is a division of application No. 13/324,216, filed on Dec. 13, 2011, now Pat. No. 8,445,592, which is a division of application No. 11/765,232, filed on Jun. 19, 2007, now Pat. No. 8,080,615.

(51) Int. Cl.
*C08L 71/02* (2006.01)

(52) U.S. Cl.
USPC ........... 525/187; 525/108; 525/104; 528/393; 528/421

(58) Field of Classification Search
USPC .................. 525/404, 108, 187; 528/393, 421
See application file for complete search history.

(56) References Cited

U.S. PATENT DOCUMENTS

| | | |
|---|---|---|
| 4,623,674 A | 11/1986 | Bailey, Jr. |
| 4,797,357 A | 1/1989 | Mura et al. |
| 4,818,713 A | 4/1989 | Feygenson |
| 4,877,647 A | 10/1989 | Klabunde |
| 5,328,810 A | 7/1994 | Lowrey et al. |
| 5,374,367 A | 12/1994 | Edamura et al. |
| 5,382,373 A | 1/1995 | Carlson et al. |
| 5,482,656 A | 1/1996 | Hiraoka et al. |
| 5,512,131 A | 4/1996 | Kumar et al. |
| 5,538,655 A | 7/1996 | Fauteux et al. |
| 5,580,700 A | 12/1996 | Rahman |
| 5,620,850 A | 4/1997 | Bamdad et al. |
| 5,622,668 A | 4/1997 | Thomas |
| 5,772,905 A | 6/1998 | Chou |
| 5,834,583 A | 11/1998 | Hancock |
| 5,849,810 A | 12/1998 | Muller |
| 5,879,582 A | 3/1999 | Havelka et al. |
| 5,879,853 A | 3/1999 | Azuma |
| 5,891,356 A | 4/1999 | Inoue et al. |
| 5,904,824 A | 5/1999 | Oh |
| 5,925,259 A | 7/1999 | Biebuyck et al. |
| 5,948,470 A | 9/1999 | Harrison et al. |
| 5,958,704 A | 9/1999 | Starzl et al. |
| 6,051,869 A | 4/2000 | Pan et al. |
| 6,111,323 A | 8/2000 | Carter et al. |
| 6,143,647 A | 11/2000 | Pan et al. |
| 6,153,495 A | 11/2000 | Kub et al. |
| 6,207,787 B1 | 3/2001 | Fahey et al. |
| 6,251,791 B1 | 6/2001 | Tsai et al. |
| 6,270,946 B1 | 8/2001 | Miller |
| 6,309,580 B1 | 10/2001 | Chou |
| 6,310,138 B1 | 10/2001 | Yonezawa et al. |
| 6,312,971 B1 | 11/2001 | Amundson et al. |
| 6,368,871 B1 | 4/2002 | Christel et al. |
| 6,403,382 B1 | 6/2002 | Zhu et al. |
| 6,414,164 B1 | 7/2002 | Afzali-Ardakani et al. |
| 6,423,465 B1 | 7/2002 | Hawker et al. |
| 6,423,474 B1 | 7/2002 | Holscher |
| 6,503,841 B1 | 1/2003 | Criscuolo et al. |
| 6,506,660 B2 | 1/2003 | Holmes et al. |
| 6,517,933 B1 | 2/2003 | Soane et al. |
| 6,518,194 B2 | 2/2003 | Winningham et al. |
| 6,537,920 B1 | 3/2003 | Krivokapic |
| 6,548,830 B1 | 4/2003 | Noguchi et al. |
| 6,565,763 B1 | 5/2003 | Asakawa |
| 6,565,764 B2 | 5/2003 | Hiraoka et al. |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,592,764 B1 | 7/2003 | Stucky et al. |
| 6,630,520 B1 | 10/2003 | Bruza et al. |
| 6,635,912 B2 | 10/2003 | Ohkubo |
| 6,656,308 B2 | 12/2003 | Hougham et al. |
| 6,679,996 B1 | 1/2004 | Yao |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |

(Continued)

FOREIGN PATENT DOCUMENTS

| | | |
|---|---|---|
| CN | 1562730 A | 1/2005 |
| CN | 1799131 A | 7/2006 |

(Continued)

OTHER PUBLICATIONS

Rozkiewicz, Dorota I., et al., 'Click' Chemistry by Microcontact Printing, Angew. Chem. Int. Ed., vol. 45, pp. 5292-5296, 2006. [Published online Jul. 12, 2006].

(Continued)

*Primary Examiner* — Robert Jones, Jr.
(74) *Attorney, Agent, or Firm* — TraskBritt

(57) ABSTRACT

Methods for fabricating a random graft PS-r-PEO copolymer and its use as a neutral wetting layer in the fabrication of sublithographic, nanoscale arrays of elements including openings and linear microchannels utilizing self-assembling block copolymers, and films and devices formed from these methods are provided. In some embodiments, the films can be used as a template or mask to etch openings in an underlying material layer.

20 Claims, 24 Drawing Sheets

(56) References Cited

U.S. PATENT DOCUMENTS

| | | |
|---|---|---|
| 6,746,825 B2 | 6/2004 | Nealey et al. |
| 6,767,693 B1 | 7/2004 | Okoroanyanwu |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross et al. |
| 6,812,132 B2 | 11/2004 | Ramachandrarao et al. |
| 6,825,358 B2 | 11/2004 | Afzali-Ardakani et al. |
| 6,884,842 B2 | 4/2005 | Soane et al. |
| 6,887,332 B1 | 5/2005 | Kagan et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,911,400 B2 | 6/2005 | Colburn et al. |
| 6,913,697 B2 | 7/2005 | Lopez et al. |
| 6,924,341 B2 | 8/2005 | Mays et al. |
| 6,926,953 B2 | 8/2005 | Nealey et al. |
| 6,940,485 B2 | 9/2005 | Noolandi |
| 6,946,332 B2 | 9/2005 | Loo et al. |
| 6,949,456 B2 | 9/2005 | Kumar |
| 6,952,436 B2 | 10/2005 | Wirnsberger et al. |
| 6,957,608 B1 | 10/2005 | Hubert et al. |
| 6,962,823 B2 | 11/2005 | Empedocles et al. |
| 6,989,426 B2 | 1/2006 | Hu et al. |
| 6,992,115 B2 | 1/2006 | Hawker et al. |
| 6,995,439 B1 | 2/2006 | Hill et al. |
| 6,998,152 B2 | 2/2006 | Uhlenbrock |
| 7,001,795 B2 | 2/2006 | Jiang et al. |
| 7,009,227 B2 | 3/2006 | Patrick et al. |
| 7,030,495 B2 | 4/2006 | Colburn et al. |
| 7,037,738 B2 | 5/2006 | Sugiyama et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,060,774 B2 | 6/2006 | Sparrowe et al. |
| 7,066,801 B2 | 6/2006 | Balijepalli et al. |
| 7,077,992 B2 | 7/2006 | Sreenivasan et al. |
| 7,087,267 B2 | 8/2006 | Breen et al. |
| 7,090,784 B2 | 8/2006 | Asakawa et al. |
| 7,112,617 B2 | 9/2006 | Kim et al. |
| 7,115,305 B2 | 10/2006 | Bronikowski et al. |
| 7,115,525 B2 | 10/2006 | Abatchev et al. |
| 7,115,995 B2 | 10/2006 | Wong |
| 7,118,784 B1 | 10/2006 | Xie |
| 7,119,321 B2 | 10/2006 | Quinlan |
| 7,132,370 B2 | 11/2006 | Paraschiv |
| 7,135,144 B2 | 11/2006 | Christel et al. |
| 7,135,241 B2 | 11/2006 | Ferraris et al. |
| 7,135,388 B2 | 11/2006 | Ryu et al. |
| 7,135,523 B2 | 11/2006 | Ho et al. |
| 7,151,209 B2 | 12/2006 | Empedocles et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner et al. |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,195,733 B2 | 3/2007 | Rogers et al. |
| 7,202,308 B2 | 4/2007 | Boussand et al. |
| 7,208,836 B2 | 4/2007 | Manning |
| 7,252,791 B2 | 8/2007 | Wasserscheid et al. |
| 7,259,101 B2 | 8/2007 | Zurcher et al. |
| 7,279,396 B2 | 10/2007 | Derderian et al. |
| 7,282,240 B1 | 10/2007 | Jackman et al. |
| 7,291,284 B2 | 11/2007 | Mirkin et al. |
| 7,311,943 B2 | 12/2007 | Jacobson et al. |
| 7,326,514 B2 | 2/2008 | Dai et al. |
| 7,332,370 B2 | 2/2008 | Chang et al. |
| 7,332,627 B2 | 2/2008 | Chandross et al. |
| 7,338,275 B2 | 3/2008 | Choi et al. |
| 7,347,953 B2 | 3/2008 | Black et al. |
| 7,368,314 B2 | 5/2008 | Ufert |
| 7,407,887 B2 | 8/2008 | Guo |
| 7,408,186 B2 | 8/2008 | Merkulov et al. |
| 7,419,772 B2 | 9/2008 | Watkins et al. |
| 7,470,954 B2 | 12/2008 | Lee et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,569,855 B2 | 8/2009 | Lai |
| 7,585,741 B2 | 9/2009 | Manning |
| 7,592,247 B2 | 9/2009 | Yang et al. |
| 7,605,081 B2 | 10/2009 | Yang et al. |
| 7,632,544 B2 | 12/2009 | Ho et al. |
| 7,655,383 B2 | 2/2010 | Mela et al. |
| 7,658,773 B2 | 2/2010 | Pinnow |
| 7,700,157 B2 | 4/2010 | Bronikowski et al. |
| 7,723,009 B2 | 5/2010 | Sandhu et al. |
| 7,767,099 B2 | 8/2010 | Li et al. |
| 7,888,228 B2 | 2/2011 | Blanchard |
| 7,959,975 B2 | 6/2011 | Millward |
| 7,964,107 B2 | 6/2011 | Millward |
| 8,039,196 B2 | 10/2011 | Kim et al. |
| 8,080,615 B2 | 12/2011 | Millward |
| 8,083,953 B2 | 12/2011 | Millward et al. |
| 8,083,958 B2 | 12/2011 | Li et al. |
| 8,097,175 B2 | 1/2012 | Millward et al. |
| 8,101,261 B2 | 1/2012 | Millward et al. |
| 8,114,300 B2 | 2/2012 | Millward |
| 8,114,301 B2 | 2/2012 | Millward et al. |
| 8,114,306 B2 | 2/2012 | Cheng et al. |
| 8,294,139 B2 | 10/2012 | Marsh et al. |
| 8,372,295 B2 | 2/2013 | Millward |
| 8,394,483 B2 | 3/2013 | Millward |
| 8,404,124 B2 | 3/2013 | Millward et al. |
| 8,409,449 B2 | 4/2013 | Millward et al. |
| 8,425,982 B2 | 4/2013 | Regner |
| 8,426,313 B2 | 4/2013 | Millward et al. |
| 8,445,592 B2 | 5/2013 | Millward |
| 2001/0024768 A1 | 9/2001 | Matsuo et al. |
| 2001/0049195 A1 | 12/2001 | Chooi et al. |
| 2002/0055239 A1 | 5/2002 | Tuominen et al. |
| 2002/0084429 A1 | 7/2002 | Craighead et al. |
| 2002/0158342 A1 | 10/2002 | Tuominen et al. |
| 2002/0158432 A1 | 10/2002 | Wain |
| 2002/0167117 A1 | 11/2002 | Chou |
| 2003/0010241 A1 | 1/2003 | Fujihira et al. |
| 2003/0034329 A1 | 2/2003 | Chou |
| 2003/0068639 A1 | 4/2003 | Haneder et al. |
| 2003/0077452 A1 | 4/2003 | Guire et al. |
| 2003/0080471 A1 | 5/2003 | Chou |
| 2003/0080472 A1 | 5/2003 | Chou |
| 2003/0091752 A1 | 5/2003 | Nealey et al. |
| 2003/0100822 A1 | 5/2003 | Lew et al. |
| 2003/0108879 A1 | 6/2003 | Klaerner et al. |
| 2003/0143375 A1 | 7/2003 | Noguchi et al. |
| 2003/0157248 A1 | 8/2003 | Watkins et al. |
| 2003/0178707 A1 | 9/2003 | Abbott |
| 2003/0180522 A1 | 9/2003 | DeSimone et al. |
| 2003/0180966 A1 | 9/2003 | Abbott et al. |
| 2003/0185741 A1 | 10/2003 | Matyjaszewski et al. |
| 2003/0196748 A1 | 10/2003 | Hougham et al. |
| 2003/0222048 A1 | 12/2003 | Asakawa et al. |
| 2003/0235930 A1 | 12/2003 | Bao et al. |
| 2004/0023287 A1 | 2/2004 | Harnack et al. |
| 2004/0028875 A1 | 2/2004 | Van Rijn et al. |
| 2004/0058059 A1 | 3/2004 | Linford et al. |
| 2004/0076757 A1 | 4/2004 | Jacobson et al. |
| 2004/0084298 A1 | 5/2004 | Yao et al. |
| 2004/0124092 A1 | 7/2004 | Black |
| 2004/0125266 A1 | 7/2004 | Miyauchi et al. |
| 2004/0127001 A1 | 7/2004 | Colburn et al. |
| 2004/0142578 A1 | 7/2004 | Wiesner et al. |
| 2004/0159633 A1 | 8/2004 | Whitesides et al. |
| 2004/0163758 A1 | 8/2004 | Kagan et al. |
| 2004/0175628 A1 | 9/2004 | Nealey et al. |
| 2004/0192013 A1 | 9/2004 | Ryu et al. |
| 2004/0222415 A1 | 11/2004 | Chou et al. |
| 2004/0242688 A1 | 12/2004 | Chandross et al. |
| 2004/0254317 A1 | 12/2004 | Hu |
| 2004/0256615 A1 | 12/2004 | Sirringhaus et al. |
| 2004/0256662 A1 | 12/2004 | Black et al. |

(56) References Cited

U.S. PATENT DOCUMENTS

| | | |
|---|---|---|
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol et al. |
| 2005/0079486 A1 | 4/2005 | Abbott et al. |
| 2005/0100830 A1 | 5/2005 | Xu et al. |
| 2005/0120902 A1 | 6/2005 | Adams et al. |
| 2005/0124135 A1 | 6/2005 | Ayazi et al. |
| 2005/0147841 A1 | 7/2005 | Tavkhelidze |
| 2005/0159293 A1 | 7/2005 | Wan et al. |
| 2005/0167651 A1 | 8/2005 | Merkulov et al. |
| 2005/0176256 A1 | 8/2005 | Kudelka |
| 2005/0208752 A1 | 9/2005 | Colburn et al. |
| 2005/0238889 A1 | 10/2005 | Iwamoto et al. |
| 2005/0238967 A1 | 10/2005 | Rogers et al. |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg |
| 2006/0035387 A1 | 2/2006 | Wagner et al. |
| 2006/0038182 A1 | 2/2006 | Rogers et al. |
| 2006/0046079 A1 | 3/2006 | Lee et al. |
| 2006/0046480 A1 | 3/2006 | Guo |
| 2006/0060863 A1 | 3/2006 | Lu et al. |
| 2006/0062867 A1 | 3/2006 | Choi et al. |
| 2006/0078681 A1 | 4/2006 | Hieda et al. |
| 2006/0097134 A1 | 5/2006 | Rhodes |
| 2006/0105562 A1 | 5/2006 | Yi |
| 2006/0124467 A1 | 6/2006 | Ho et al. |
| 2006/0128165 A1 | 6/2006 | Theiss et al. |
| 2006/0134556 A1 | 6/2006 | Nealey et al. |
| 2006/0137554 A1 | 6/2006 | Kron et al. |
| 2006/0141222 A1 | 6/2006 | Fischer et al. |
| 2006/0141245 A1 | 6/2006 | Stellacci et al. |
| 2006/0154466 A1 | 7/2006 | Lee et al. |
| 2006/0163646 A1 | 7/2006 | Black et al. |
| 2006/0192283 A1 | 8/2006 | Benson |
| 2006/0205875 A1 | 9/2006 | Cha et al. |
| 2006/0211871 A1 | 9/2006 | Dai |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealey et al. |
| 2007/0023247 A1 | 2/2007 | Ulicny et al. |
| 2007/0023805 A1 | 2/2007 | Wells et al. |
| 2007/0045562 A1 | 3/2007 | Parekh |
| 2007/0045642 A1 | 3/2007 | Li |
| 2007/0071881 A1 | 3/2007 | Chua et al. |
| 2007/0072403 A1 | 3/2007 | Sakata |
| 2007/0122749 A1 | 5/2007 | Fu et al. |
| 2007/0122932 A1 | 5/2007 | Kodas et al. |
| 2007/0138131 A1 | 6/2007 | Burdinski |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0183035 A1 | 8/2007 | Asakawa et al. |
| 2007/0194403 A1 | 8/2007 | Cannon et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0224823 A1 | 9/2007 | Sandhu |
| 2007/0227383 A1 | 10/2007 | Decre et al. |
| 2007/0249117 A1 | 10/2007 | Kang et al. |
| 2007/0272951 A1 | 11/2007 | Lieber et al. |
| 2007/0281220 A1 | 12/2007 | Sandhu |
| 2007/0289943 A1 | 12/2007 | Lu et al. |
| 2007/0293041 A1 | 12/2007 | Yang |
| 2008/0032238 A1 | 2/2008 | Lu et al. |
| 2008/0038467 A1 | 2/2008 | Jagannathan et al. |
| 2008/0038923 A1 | 2/2008 | Edelstein et al. |
| 2008/0041818 A1 | 2/2008 | Kihara et al. |
| 2008/0047930 A1 | 2/2008 | Blanchet et al. |
| 2008/0064217 A1 | 3/2008 | Horii |
| 2008/0073743 A1 | 3/2008 | Alizadeh et al. |
| 2008/0078999 A1 | 4/2008 | Lai |
| 2008/0083991 A1 | 4/2008 | Yang et al. |
| 2008/0085601 A1 | 4/2008 | Park et al. |
| 2008/0093743 A1 | 4/2008 | Yang et al. |
| 2008/0102252 A1 | 5/2008 | Black et al. |
| 2008/0103256 A1 | 5/2008 | Kim et al. |
| 2008/0113169 A1 | 5/2008 | Cha et al. |
| 2008/0164558 A1 | 7/2008 | Yang et al. |
| 2008/0174726 A1 | 7/2008 | Kim |
| 2008/0176767 A1 | 7/2008 | Millward |
| 2008/0193658 A1 | 8/2008 | Millward |
| 2008/0217292 A1 | 9/2008 | Millward et al. |
| 2008/0233297 A1 | 9/2008 | de Jong et al. |
| 2008/0233323 A1 | 9/2008 | Cheng et al. |
| 2008/0257187 A1 | 10/2008 | Millward |
| 2008/0260941 A1 | 10/2008 | Jin |
| 2008/0274413 A1 | 11/2008 | Millward |
| 2008/0286659 A1 | 11/2008 | Millward |
| 2008/0311347 A1 | 12/2008 | Millward et al. |
| 2008/0315270 A1 | 12/2008 | Marsh et al. |
| 2008/0318005 A1 | 12/2008 | Millward |
| 2009/0062470 A1 | 3/2009 | Millward et al. |
| 2009/0155579 A1 | 6/2009 | Greco et al. |
| 2009/0200646 A1 | 8/2009 | Millward et al. |
| 2009/0206489 A1 | 8/2009 | Li et al. |
| 2009/0212016 A1 | 8/2009 | Cheng et al. |
| 2009/0218567 A1 | 9/2009 | Mathew et al. |
| 2009/0236309 A1 | 9/2009 | Millward et al. |
| 2009/0240001 A1 | 9/2009 | Regner |
| 2009/0263628 A1 | 10/2009 | Millward |
| 2009/0267058 A1 | 10/2009 | Namdas et al. |
| 2009/0274887 A1 | 11/2009 | Millward et al. |
| 2009/0317540 A1 | 12/2009 | Sandhu et al. |
| 2010/0092873 A1 | 4/2010 | Sills et al. |
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0163180 A1 | 7/2010 | Millward |
| 2010/0204402 A1 | 8/2010 | Millward et al. |
| 2010/0279062 A1 | 11/2010 | Millward et al. |
| 2010/0316849 A1 | 12/2010 | Millward et al. |
| 2010/0323096 A1 | 12/2010 | Sills et al. |
| 2011/0232515 A1 | 9/2011 | Millward |
| 2012/0133017 A1 | 5/2012 | Millward et al. |
| 2012/0223053 A1 | 9/2012 | Millward et al. |

FOREIGN PATENT DOCUMENTS

| | | |
|---|---|---|
| CN | 101013662 A | 8/2007 |
| EP | 0784543 B1 | 4/2000 |
| EP | 1416303 A2 | 5/2004 |
| EP | 1906237 A2 | 4/2008 |
| EP | 1593164 B1 | 6/2010 |
| JP | 11080414 A | 3/1999 |
| JP | 2003155365 A | 5/2003 |
| JP | 2004335962 A | 11/2004 |
| JP | 2005008882 A | 1/2005 |
| JP | 2005029779 A | 2/2005 |
| JP | 2006036923 A | 2/2006 |
| JP | 2006055982 A | 3/2006 |
| JP | 2006110434 A | 4/2006 |
| JP | 2007194175 A | 8/2007 |
| JP | 2008036491 A | 2/2008 |
| JP | 2008043873 A | 2/2008 |

(56) References Cited

FOREIGN PATENT DOCUMENTS

| | | |
|---|---|---|
| KR | 20060128378 A | 12/2006 |
| KR | 20070029762 A | 3/2007 |
| KR | 100771886 B1 | 11/2007 |
| TW | 200400990 | 3/1992 |
| TW | 200633925 | 10/1994 |
| TW | 200740602 | 1/1996 |
| TW | 200802421 | 2/1996 |
| TW | 584670 B | 4/2004 |
| TW | 200419017 | 10/2004 |
| TW | 200511364 | 3/2005 |
| TW | I256110 B | 6/2006 |
| TW | I253456 | 11/2007 |
| WO | 9007575 | 7/1990 |
| WO | 9706013 A1 | 2/1997 |
| WO | 9839645 A1 | 9/1998 |
| WO | 9947570 A1 | 9/1999 |
| WO | 0031183 A1 | 6/2000 |
| WO | 0218080 A1 | 3/2002 |
| WO | 02081372 A2 | 10/2002 |
| WO | 03045840 A2 | 6/2003 |
| WO | 2005122285 A2 | 12/2005 |
| WO | 2006003592 A2 | 1/2006 |
| WO | 2006003594 A2 | 1/2006 |
| WO | 2006076016 A2 | 7/2006 |
| WO | 2006078952 A1 | 7/2006 |
| WO | 2006112887 A2 | 10/2006 |
| WO | 2007001294 A1 | 1/2007 |
| WO | 2007013889 A2 | 2/2007 |
| WO | 2007024241 A2 | 3/2007 |
| WO | 2007024323 A2 | 3/2007 |
| WO | 2007019439 A3 | 5/2007 |
| WO | 2007055041 A1 | 5/2007 |
| WO | 2008055137 A2 | 5/2008 |
| WO | 2008091741 A2 | 7/2008 |
| WO | 2008096335 A2 | 8/2008 |
| WO | 2008097736 A2 | 8/2008 |
| WO | 2008118635 A2 | 10/2008 |
| WO | 2008124219 A2 | 10/2008 |
| WO | 2008130847 A1 | 10/2008 |
| WO | 2008145268 A1 | 12/2008 |
| WO | 2008156977 A1 | 12/2008 |
| WO | 2009099924 A2 | 8/2009 |
| WO | 2009102551 A2 | 8/2009 |
| WO | 2009117238 A2 | 9/2009 |
| WO | 2009117243 A1 | 9/2009 |
| WO | 2009134635 A2 | 11/2009 |

OTHER PUBLICATIONS

Ruiz et al., Density Multiplication and Improved Lithography by Directed Block Copolymer Assembly, Science, vol. 321, Aug. 15, 2008, pp. 936-939.

Ruiz et al., Induced Orientational Order in Symmetric Diblock Copolymer Thin-Films, Advanced Materials, vol. 19, No. 4, pp. 587-591, (2007).

Ryu et al., Surface Modification with Cross-Linked Random Copolymers: Minimum Effective Thickness, Macromolecules, vol. 40, No. 12, 2007, American Chemical Society, pp. 4296-4300.

Sang et al., Epitaxial Self-Assembly of Block Copolymers on Lithographically Defined Nanopatterned Substrates, Nature, vol. 24, (Jul. 24, 2003), pp. 411-414.

Saraf et al., Spontaneous Planarization of Nanoscale Phase Separated Thin Film, Applied Physics Letters, vol. 80, No. 23, Jun. 10, 2002, American Institute of Physics, pp. 4425-4427.

Sato et al., Novel Antireflective Layer Using Polysilane for Deep Ultraviolet Lithography, J. Vac. Sci. Technol. B, vol. 17, No. 6, (Nov./Dec. 1999), pp. 3398-3401.

Sawhney et al., Bioerodible Hydrogels Based on Photopolymerized Poly(ethylene glycol)-co-poly(a-hydroxy acid) Diacrylate Macromers, Macromolecules 1993, 26, American Chemical Society, pp. 581-587, Abstract only.

Segalman, R. A., Patterning with Block Copolymer Thin Films, Materials Science and Engineering R 48 (2005), Elsevier B. V., pp. 191-226.

Shahrjerdi et al., Fabrication of Ni Nanocrystal Flash Memories Using a Polymeric Self-Assembly Approach, IEEE Electron Device Letters, vol. 28, No. 9, Sep. 2007, pp. 793-796.

Sharma et al., Ultrathin Poly(ethylene glycol) Films for Silicon-based Microdevices, Applied Surface Science, 206 (2003), Elsevier Science B.V., pp. 218-229.

Sigma-Aldrich, 312-315Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.

Sivaniah et al., Observation of Perpendicular Orientation in Symmetric Diblock Copolymer Thin Films on Rough Substrates, Macromolecules 2003, 36, American Chemical Society, pp. 5894-5896.

Sivaniah et al., Symmetric Diblock Copolymer Thin Films on Rough Substrates, Kinetics and Structure Formation in Pure Block Copolymer Thin Films, Macromolecules 2005, 38, American Chemical Society, pp. 1837-1849.

Sohn et al., Fabrication of the Multilayered Nanostructure of Alternating Polymers and Gold Nanoparticles with Thin Films of Self-Assembling Diblock Copolymers, Chem. Mater., vol. 13, (2001), pp. 1752-1757.

Solak, H. H., Nanolithography with Coherent Extreme Ultraviolet Light, Journal of Physics D: Applied Physics, 2006, IOP Publishing Ltd., UK, pp. R171-R188.

Srinvivasan et al., Scanning Electron Microscopy of Nanoscale Chemical Patterns, ACS Nano, vol. 1, No. 3, pp. 191-201, 2007.

Stoykovich et al., Directed Assembly of Block Copolymer Blends into Nonregular Device-Oriented Structures, Science, vol. 308, Jun. 3, 2005, pp. 1442-1446.

Stoykovich, M. P., et al., Directed Self-Assembly of Block Copolymers for Nanolithography: Fabrication of Isolated Features and Essential Integrated Circuit Geometries, ACS Nano, vol. 1, No. 3, 2007, pp. 168-175.

Sundrani et al., Guiding Polymers to Perfection: Macroscopic Alignment of Nanoscale Domains, Nano Lett., vol. 4, No. 2, 2004, American Chemical Society, pp. 273-276.

Sundrani et al., Hierarchical Assembly and Compliance of Aligned Nanoscale Polymer Cylinders in Confinement, Langmuir 2004, vol. 20, No. 12, 2004, American Chemical Society, pp. 5091-5099.

Tadd et al, Spatial Distribution of Cobalt Nanoclusters in Block Copolymers, Langmuir, vol. 18, (2002), pp. 2378-2384.

Tang et al., Evolution of Block Copolymer Lithography to Highly Ordered Square Arrays, Science, vol. 322, No. 5900, (Sep. 25, 2008), pp. 429-432.

Trimbach et al., Block Copolymer Thermoplastic Elastomers for Microcontact Printing, Langmuir, vol. 19, (2003), pp. 10957-10961.

Truskett et al., Trends in Imprint Lithography for Biological Applications, TRENDS in Biotechnology, vol. 24, No. 7, Jul. 2006, pp. 312-315.

Tseng et al., Enhanced Block Copolymer Lithography Using Sequential Infiltration Synthesis, J. of Physical Chemistry, (Jul. 11, 2011), 16 pgs.

Van Poll et al., Self-Assembly Approach to Chemical Micropatterning of Poly(dimethylsiloxane), Angew. Chem. Int. Ed. 2007, 46, pp. 6634-6637.

Wang et al., One Step Fabrication and characterization of Platinum Nanopore Electrode Ensembles formed via Amphiphilic Block Copolymer Self-assembly, Electrochimica Acta 52 (2006), pp. 704-709.

Wathier et al., Dendritic Macromers as in Situ Polymerizing Biomaterials for Securing Cataract Incisions, J. Am. Chem. Soc., 2004, 126 (40), pp. 12744-12745, Abstract only.

Winesett et al., Tuning Substrate Surface Energies for Blends of Polystyrene and Poly(methyl methacrylate), Langmuir 2003, 19, American Chemical Society, pp. 8526-8535.

WIPF, Handbook of Reagents for Organic Synthesis, 2005, John Wiley & Sons Ltd., p. 320.

Wu et al., Self-Assembled Two-Dimensional Block Copolymers on Pre-patterned Templates with Laser Interference Lithography, IEEE, 2007, pp. 153-154.

Xia et al., An Approach to Lithographically Defined Self-Assembled Nanoparticle Films, Advanced Materials, vol. 18, (2006), pp. 930-933.

(56) References Cited

OTHER PUBLICATIONS

Xia et al., Soft Lithography, Annu. Rev. Mater. Sci., vol. 28, (1998), pp. 153-184.
Xiao, Shuaigang., et al., Graphoepitaxy of Cylinder-forming Block Copolymers for Use as Templates to Pattern Magnetic Metal Dot Arrays, Nanotechnology 16, IPO Publishing Ltd, UK (2005), pp. S324-S329.
Xu et al., Electric Field Alignment of Symmetric Diblock Copolymer Thin Films, Macromolecules, (2003), 5 pgs.
Xu et al., Interfacial Interaction Dependence of Microdomain Orientation in Diblock Copolymer Thin Films, Macromolecules, vol. 38, (2005), pp. 2802-2805.
Xu et al., Surface-Initiated Atom Transfer Radical Polymerization from Halogen-Terminated Si(111) (Si-X, X=Cl, Br) Surfaces for the Preparation of Well-Defined Polymer—Si Hybrids, Langmuir, vol. 21, No. 8 (2005), pp. 3221-3225.
Xu et al., The Influence of Molecular Weight on Nanoporous Polymer Films, Polymer 42, Elsevier Science Ltd., (2001) pp. 9091-9095.
Yamaguchi et al., Resist-Pattern Guided Self-Assembly of Symmetric Diblock Copolymer, Journal of Photopolymer Science and Technology, vol. 19, No. 3, pp. 385-388 (2006).
Yamaguchi et al., Two-dimensional Arrangement of Vertically Oriented Cylindrical Domains of Diblock Copolymers Using Graphoepitaxy with Artificial Guiding Pattern Layout, Microprocesses and Nanotechnology, 2007, Conference date Nov. 5-8, 2007, pp. 434-435.
Yan et al., Preparation and Phase Segregation of Block Copolymer Nanotube Multiblocks, J. Am. Chem. Soc., vol. 126, No. 32, 2004, American Chemical Society, pp. 10059-10066.
Yang et al., Covalently Attached Graft Polymer Monolayer on Organic Polymeric Substrate via Confined Surface Inhibition Reaction, J. Polymer Sci.—A—Polymer Chemistry Ed., vol. 45, Issue 5, (2007), pp. 745-755.
Yang et al., Guided Self-Assembly of Symmetric Diblock Copolymer Films on Chemically Nanopatterned Substrates, Macromolecules 2000, vol. 33, No. 26, 2000, American Chemical Society, pp. 9575-9582.
Yang et al., Nanoscopic Templates Using Self-assembled Cylindrical Diblock Copolymers for Patterned Media, J. Vac. Sci. Technol. B 22(6), Nov./Dec. 2004, American Vacuum Society, pp. 3331-3334.
Yu et al., Contact Printing Beyond Surface Roughness: Liquid Supramolecular Nanostamping, Advanced Materials, vol. 19, (2007), pp. 4338-4342.
Yurt et al., Scission of Diblock Copolymers into Their Constituent Blocks, Macromolecules 2006, vol. 39, No. 5, 2006, American Chemical Society, pp. 1670-1672.
Zaumseil et al., Three-Dimensional and Multilayer Nanostructures Formed by Nanotransfer Printing, Nano Letters, vol. 3, No. 9,(2003) pp. 1223-1227.
Zehner et al., Selective Decoration of a Phase-Separated Diblock Copolymer with Thiol-Passivated Gold Nanocrystals, Langmuir, vol. 14, No. 2, Jan. 20, 1998, pp. 241-244.
Zhang et al., Self-Assembled Monolayers of Terminal Alkynes on Gold, J. Am. Chem. Soc., vol. 129, No. 16, (2007), pp. 4876-4877.
La et al., Directed Assembly of Cylinder-Forming Block Copolymers into Patterned Structures to Fabricate Arrays of Spherical Domains and Nanoparticles, Chem. Mater, 2007, vol. 19, No. 18, Department of Chemical and Biological Engineering and Center for Nanotechnology, Univ. of Wisconsin, pp. 4538-4544.
La et al., Pixelated Chemically Amplified Resists: Investigation of Material Structure on the Spatial Distribution of Photoacids and Line Edge Roughness, J. Vac. Sci. Technol. B 25(6), Nov./Dec. 2007, American Vacuum Society, pp. 2508-2513.
Laracuente et al., Step Structure and Surface Morphology of Hydrogen-terminated Silicon: (001) to (114), Surface Science 545, 2003, pp. 70-84.
Lentz et al., Whole Wafer Imprint Patterning Using Step and Flash Imprint Lithography: A Manufacturing Solution for Sub 100 nm Patterning, SPIE Advanced Lithography Paper, http://molecularimprints.com/NewsEvents/tech_articles/new_articles/SPIE_07_MII_WW_Paper.pdf), Molecular Imprints, Inc., Texas, USA, Feb. 2007, pp. 1-10.
Li et al., Block Copolymer Patterns and Templates, Materials Today, vol. 9, No. 9, Sep. 2006, pp. 30-39.
Li et al., Creation of Sub-20-nm Contact Using Diblock Copolymer on a 300 mm Wafer for Complementary Metal Oxide Semiconductor Applications, J. Vac. Sci. Technol. B 25(6), Nov./Dec. 2007, American Vacuum Society, pp. 1982-1984.
Li et al., Morphology Change of Asymmetric Diblock Copolymer Micellar Films During Solvent Annealing, ScienceDirect, Polymer 48 (2007), pp. 2434-2443.
Li et al., A Method for Patterning Multiple Types of Cells by Using Electrochemical Desorption of Self-Assembled Monolayers within Microfluidic Channels, Angew. Chem. Int. Ed., vol. 46, (2007), pp. 1094-1096.
Lin et al., A Rapid Route to Arrays of Nanostructures in Thin Films, Adv. Mater. 2002, 14 No. 19, Oct. 2, pp. 1373-1376.
Lin-Gibson et al., Structure-Property Relationships of Photopolymerizable Poly(ethylene glycol) Dimethacrylate Hydrogels, Macromolecules 2005, 38, American Chemical Society, pp. 2897-2902.
Liu et al., Pattern Transfer Using Poly(styrene-block-methyl methacrylate) Copolymer Films and Reactive Ion Etching, J. Vac. Sci. Technol. B, vol. 25, No. 6, (Nov./Dec. 2007), pp. 1963-1968.
Loo et al., Additive, Nanoscale Patterning of Metal Films with a Stamp and a Surface Chemistry Mediated Transfer Process: Applications in Plastic Electronics, Applied Physics Letters, vol. 81, No. 3, (Jul. 15, 2002), pp. 562-564.
Lopes et al., Hierarchical Self-Assembly of Metal Nanostructures on Diblock Copolymer Scaffolds, Nature, vol. 414, (Dec. 13, 2001), pp. 735-738.
Lutolf et al., Cell-Responsive Synthetic Hydrogels, Adv. Mater., vol. 15, No. 11, Jun. 2003, pp. 888-892.
Lutolf et al., Synthetic Biomaterials as Instructive Extracellular Microenvironments for Morphogenesis in Tissue Engineering, Nature Biotechnology, 23, 47-55 (2005), Abstract only.
Lutz, 1,3-Dipolar Cycloadditions of Azides and Alkynes: A Universal Ligation Tool in Polymer and Materials Science, Angew. Chem. Int. Ed., vol. 46, (2007), pp. 1018-1025.
Malenfant et al., Self-Assembly of an Organic-Inorganic Block Copolymer for Nano-Ordered Ceramics, Nature Nanotechnology, vol. 2, (Jan. 2007), pp. 43-46.
Malkoch et al., Synthesis of Well-defined Hydrogel Networks Using Click Chemistry, Chem. Commun., 2006, The Royal Society of Chemistry, pp. 2774-2776.
Mansky et al., Controlling Polymer-Surface Interactions with Random Copolymer Brushes, Science, vol. 275, Mar. 7, 1997, pp. 1458-1460.
Martens et al., Characterization of Hydrogels Formed from Acrylate Modified Poly(vinyl alcohol) Macromers, Polymer, vol. 41, Issue 21, (Oct. 2000), pp. 7715-7722 (Abstract only).
Matsuda et al., Photoinduced Prevention of Tissue Adhesion, ASAIO J, Jul.-Sep. 1992; 38(3): M154-7, Abstract only.
Maye et al., Chemical Analysis Using Force Microscopy, Journal of Chemical Education, vol. 79, No. 2, Feb. 2002, Dept. of Chemistry, State Univ. of New York at Binghamton, USA, pp. 207-210.
Melde et al., Silica Nanostructures Templated by Oriented Block Copolymer Thin Films Using Pore-Filling and Selective-Mineralization Routes, Chem. Mater., vol. 17, No. 18, (Aug. 13, 2005), pp. 4743-4749.
Metters et al., Network Formation and Degradation Behavior of Hydrogels Formed by Michael-Type Addition Reactions, Biomacromolecules 2005, 6, 2005, pp. 290-301.
Meyer et al., Controlled Dewetting Processes on Microstructured Surfaces—a New Procedure for Thin Film Microstructuring, Macromollecular Mater. Eng., 276/277, 2000, Institute of Polymer Research Dresden, pp. 44-50.
Mezzenga et al., On the Role of Block Copolymers in Self-Assembly of Dense Colloidal Polymeric Systems, Langmuir 2003, vol. 19, No. 20, 2003, American Chemical Society, pp. 8144-8147.

(56) References Cited

OTHER PUBLICATIONS

Mindel et al., A Study of Bredig Platinum Sols, The Chemical Laboratories of New York University, received Jun. 10, 1943, vol. 65 pp. 2112.
Naito et al., 2.5-Inch Disk Patterned Media Prepared by an Artificially Assisted Self-Assembling Method, IEEE Transactions on Magnetics, vol. 38, No. 5, Sep. 2002, pp. 1949-1951.
Nealey et al., Self-Assembling Resists for Nanolithography, IProceedings of the IEEE International Electron Devices Meeting, IEDM Technical Digest, 356-359 (2005).
Nguyen, K. T., et al., Photopolymerizable Hydrogels for Tissue Engineering Applications, Biomaterials 23, 2002, pp. 4307-4314.
Nishikubo, T., Chemical Modification of Polymers via a Phase-Transfer Catalyst or Organic Strong Base, American Chemical Society Symposium Series, 1997, American Chemical Society, pp. 214-230.
Niu et al., Stability of Order in Solvent-Annealed Block Copolymer Thin Films, Macromolecules, vol. 36, No. 7, 2003, Univ. of Nebraska, USA, pp. 2428-2440, (web release date: Mar. 13, 2003) (http://digitalcommons.uni.edu/cgi/viewcontent.cgi?article+1005&contect=chemeng_nanotechnology).
Niu et al., Selective Assembly of Nanoparticles on Block Copolymer by Surface Modification, Nanotechnology, vol. 18, (2007), pp. 1-4.
Olayo-Valles et al. Large Area Nanolithographic Templates by Selective Etching of Chemically Stained Block Copolymer Thin Films, J. Mater. Chem, 2004, 14, The Royal Society of Chemistry, pp. 2729-2731.
Parejo et al., Highly Efficient UV-absorbing Thin-film Coatings for Protection of Organic Materials Against Photodegradation, J. Mater. Chem., 2006, 16, The Royal Society of Chemistry, pp. 2165-2169.
Park et al., Fabrication of Highly Ordered Silicon Oxide Dots and Stripes from Block Copolymer Thin Films, Advanced Materials, vol. 20, (2008), pp. 681-685.
Park et al., High-Aspect-Ratio Cylindrical Nanopore Arrays and Their Use for Templating Titania Nanoposts, Advanced Materials, vol. 20, (2008), pp. 738-742.
Park et al., Enabling Nanotechnology with Self Assembled Block Copolymer Patterns, Polymer 44, 2003, pp. 6725-6760.
Park et al., the Fabrication of Thin Films with Nanopores and Nanogrooves from Block Copolymer Thin Films on the Neutral Surface of Self-assembled Monolayers, Nanotechnology 18, 2007, 355304, 110P Publishing Ltd, UK,pp. 1-7.
Park et al., Block Copolymer Lithography: Periodic Arrays of 10¹¹ Holes in 1 Square Centimeter, Science, vol. 276, No. 5317, May 30, 1997, pp. 1401-1404.
Park et al., Directed assembly of lamellae-forming block copolymers using chemically and topographically patterned substrates, Advanced Materials, vol. 19, No. 4, pp. 607-611, Feb. 2007.
Park et al., Block Copolymer Multiple Patterning Integrated with Conventional ArF Lithography, Soft Matter, 2010, 6, Royal Society of chemistry, pp. 120-125.
Park et al., Controlled Ordering of Block Copolymer Thin Films by the Addition of Hydrophilic Nanoparticles, Macromolecules 2007, vol. 40, No. 22, American Chemical Society, pp. 8119-8124.
Peng, J., et al., Development of Nanodomain and Fractal Morphologies in Solvent Annealed Block copolymer Thin Films, Macromol. Rapid Commun. 2007, 28, pp. 1422-1428.
Peters et al., Combining Advanced Lithographic Techniques and Self-assembly of Thin Films of Diblock Copolymers to Produce Templates for Nanofabrication, J. Vac. Sci. Technol. B, vol. 18, No. 6, Nov./Dec. 2000, American Vacuum Society, pp. 3530-3532.
Peters et al., Morphology of Thin Films of Diblock Copolymers on Surfaces Micropatterned with Regions of Different Interfacial Energy, Macromolecules, vol. 35, No. 5, 2002, American Chemical Society, pp. 1822-1834.
Potemkin et al., Effect of the Molecular Weight of AB Diblock Copolymers on the Lamellar Orientation in Thin Films: Theory and Experiment, Macromol. Rapid Commun., 2007, 28, pp. 579-584.
Reed et al., Molecular Random Access Memory Cell, Appl. Phys. Lett., vol. 78, No. 23, (Jun. 4, 2001), pp. 3735-3737.

Resnick et al., Initial Study of the Fabrication of Step and Flash Imprint Lithography Templates for the Printing of Contact Holes, Microlith., Microfab., Microsyst., vol. 3, No. 2, Apr. 2004, Society of Photo-Optical Instrumentation Engineers, pp. 316-321.
Rogers, J. A., Slice and Dice, Peel and Stick: Emerging Methods for Nanostructure Fabrication, ACS Nano, vol. 1, No. 3, 2007, pp. 151-153.
Ge et al., Thermal Conductance of Hydrophilic and Hydrophobic Interfaces, PRL 96, 186101-1-186101-4, The American Physical Society, week ending May 12, 2006.
Gelest Inc., Silane Coupling Agents: Connecting Across Boundaries, v2.0, 2006, pp. 1-56.
Genua et al., Functional Patterns Obtained by Nanoimprinting Lithography and Subsequent Growth of Polymer Brushes, Nanotechnology, 18, (2007), IOP Publishing Ltd., pp. 1-7.
Gillmor et al., Hydrophilic/Hydrophobic Patterned Surfaces as Templates for DNA Arrays, Langmuir 2000, vol. 16, No. 18, 2000, pp. 7223-7228.
Grubbs, Hybrid Metal-Polymer Composites from Functional Block Copolymers, J. of Polymer Sci.: Part A: Polymer Chemistry, vol. 43, Issue 19, (Oct. 1, 2005), pp. 4323-4336.
Guarini et al., Nanoscale Patterning Using Self-Assembled Polymers for Semiconductor Applications, J. Vac. Sci. Technol. B 19(6), (Nov./Dec. 2001), pp. 2784-2788.
Gudipati et al., Hyperbranched Fluoropolymer and Linear Poly(ethylene glycol) Based Amphiphilic Crosslinked Networks as Efficient Antifouling Coatings: An Insight into the Surface Compositions, Topographies, and Morphologies, Journal of Polymer Science Part A: Polymer Chemistry, vol. 42, (2004), pp. 6193-6208.
Guo et al., Synthesis and Characterization of Novel Biodegradable Unsaturated Poly(ester amide)/Poly(ethylene glycol) Diacrylate Hydrogels, Abstract only, Journal of Polymer Science Part A: Polymer Chemistry, vol. 43, Issue 17, 2005 Wiley Periodicals, Inc., pp. 3932-3944.
Hadziioannou, Semiconducting Block Copolymers for Self-Assembled Photovoltaic Devices, MRS Bulletin, (Jun. 2002), pp. 456-460.
Hamers, Passivation and Activation: How Do Monovalent Atoms Modify the Reactivity of Silicon Surfaces? A Perspective on the Article, "The Mechanism of Amine Formation on Si(100) Activated with Chlorine Atoms," by C.C. Fustad, A.D. Thorsness, and A.J. Muscat, Surface Sci., vol. 600, (2006), pp. 3361-3362.
Hamley, I. W., Introduction to Block Copolymers, Developments in Block Copolymers Science and Technology, John Wiley & Sons, Ltd., 2004, pp. 1-29.
Hammond et al., Temperature Dependence of Order, Disorder, and Defects in Laterally Confined Diblock Copolymer Cylinder Monolayers, Macromolecules, vol. 38, Jul. 2005; American Chemical Society, p. 6575-6585.
Harrison et al., Layer by Layer Imaging of Diblock Copolymer Films with a Scanning Electron Microscope, Polymer, vol. 39, No. 13, 1998, pp. 2733-2744.
Hawker et al., Facile Synthesis of Block Copolymers for Nanolithographic Applications, Polymer Reprints, American Chemical Society (2005).
Hawker et al., Abstract for Improving the Manufacturability and Structural Control of Block Copolymer Lithography, Abstracts of Papers, 232nd ACS National Meeting, San Francisco, CA, Sep. 10-14, 2006.
Hayward et al., Crosslinked Poly(styrene)-block-Poly(2-vinylpyridine) Thin Films as Swellable Templates for Mesostructured Silica and Titania, Advanced Materials, vol. 17, (2005), pp. 2591-2595.
He et al., Self-Assembly of Block Copolymer Micelles in an Ionic Liquid, J. Am. Chem. Soc. 2006, 128, pp. 2745-2750.
Helmbold et al., Optical Absorption of Amorphous Hydrogenated Carbon Thin Films, Thin Solid Films 283 (1996) pp. 196-203.
Helmuth et al., High-Speed Microcontact Printing, J. Am. Chem. Soc., vol. 128, No. 29, (2006), pp. 9296-9297.
Hermans et al., Application of Solvent-Directed Assembly of Block Copolymers to the Synthesis of Nanostructured Materials with Low Dielectric Constants, Angewandte Chem. Int. Ed., vol. 45, Issue 40, Oct. 13, 2006, pp. 6648-6652.

(56) References Cited

OTHER PUBLICATIONS

Horiuchi et al., Three-Dimensional Nanoscale Alignment of Metal Nanoparticles Using Block Copolymer Films as Nanoreactors, Langmuir, vol. 19, (2003), pp. 2963-2973.

Huang et al., Stretchable Gold Conductors on Elastomeric Substrates, Applied Physics Letters, vol. 82, No. 15, (Apr. 14, 2003), pp. 2404-2406.

Huang et al., Using Surface Active Random Copolymers to Control the Domain Orientation in Diblock Copolymer Thin Films, Macromolecules, vol. 31, (1998), pp. 7641-7650.

Hur et al., Nanotransfer Printing by Use of Noncovalent Surface Forces: Applications to Thin-Film Transistors That Use Single-Walled Carbon Nanotube Networks and Semiconducting Polymers, Applied Physics Letters, vol. 85, No. 23, (Dec. 6, 2004), pp. 5730-5732.

Hutchison et al., Polymerizable Living Free Radical Initiators as a Platform to Synthesize Functional Networks, Chem. Mater., vol. 17, No. 19, 2005, pp. 4789-4797.

Ikeda et al., Control of Orientation of Thin Films of Organic Semiconductors by Graphoepitaxy, NanotechJapan Bulletin—vol. 3, No. 3, Dec. 17, 2010/Focus 26-06, NIMS International Center for Nanotechnology Network.

In et al., Side-Chain-Grafted Random Copolymer Brushes as Neutral Surfaces for Controlling the Orientation of Block Copolymer Microdomains in Thin Films, Langmuir, vol. 22, No. 18, 2006, Department of Materials Science and Engineering and Chemical and Biological Engineering, Univ. of Wisconsin-Madison, pp. 7855-7860.

Ji et al., Generalization of the Use of Random Copolymers to Control the Wetting Behaviors of Block Copolymer Films, Macromolecules, 2008, 41(23): 9098-9103.

Ji et al., Molecular Transfer Printing Using Block Copolymers, ACS Nano, vol. 4, No. 2, 2010, Dept. of Chemical and Biological Engineering, Univ. of Wisconsin, pp. 599-609.

Ji et al., Preparation of Neutral Wetting Brushes for Block Copolymer Films from Homopolymer Blends, submitted to Advanced Materials, 20(16): 3054-3060; published online Jul. 7, 2008.

Jiang et al., Electrochemical Desorption of Self-Assembled Monolayers Noninvasively Releases Patterned Cells from Geometrical Confinements, J. Am. Chem. Soc., vol. 125, No. 9, (2003), pp. 2366-2367.

Johnson et al., Probing the Stability of the Disulfide Radical Intermediate of Thioredoxin Using Direct Electrochemistry, Letters in Peptide Sci., vol. 10, (2003), pp. 495-500.

Jun et al., Microcontact Printing Directly on the Silicon Surface, Langmuir, 2002, 18(9), pp. 3415-3417, Abstract only.

Jun et al., Patterning Protein Molecules on Poly(ethylene glycol) Coated Si(111), Biomaterials, vol. 25, (2004), pp. 3503-3509.

Karim et al., Control of Ordering Kinetics and Morphology Using Zone Annealing of Thin Block Copolymer Films, Abstract submitted for the Mar. 2007 Meeting of the American Physical Society, Nov. 20, 2006.

Kavakli et al., Single and Double-Layer Antireflection Coatings on Silicon, Turk J. Phys., vol. 26, (2002), pp. 349-354.

Kim et al., Self-assembled Hydrogel Nanoparticles Composed of Dextran and Poly (ethylene glycol) Macromer, Int J Pharm., Sep. 15, 2000; 205(1-2): 109-116, Abstract only.

Kim et al., Epitaxial Self-assembly of Block Copolymers on Lithographically Defined Nanopatterned Substrates, Nature, vol. 424, Jul. 24, 2003, Dept. of Chemical Engineering and Center for Nanotechnology, and Dept. of Mechanical Engineering, Univ. of Wisconsin, pp. 411-414.

Kim et al., Novel Complex Nanostructure from Directed Assembly of Block Copolymers on Incommensurate Surface Patterns, Adv. Mater., 2007, 19, pp. 3271-3275.

Kim et al., Highly Oriented and Ordered Arrays from Block Copolymers via Solvent Evaporation, Adv. Mater. 2004, 16, No. 3, Feb. 3, pp. 226-231.

Kim et al., Salt Complexation in Block Copolymer Thin Films, Macromolecules 2006, vol. 39, No. 24, 2006, pp. 8473-8479.

Kim et al., Solvent-Induced Ordering in Thin Film Diblock Copolymer/Homopolymer Mixtures, Advanced Mater., vol. 16, No. 23-24, Dec. 17, 2004, pp. 2119-2123.

Kim et al., In Vitro Release Behavior of Dextran-methacrylate Hydrogels Using Doxorubicin and Other Model Compounds, J Biomater Appl., Jul. 2000; 15(1): 23-46 Abstract only.

Kim et al., Synthesis and characterization of Dextran-methacrylate Hydrogels and Structural Study by Sem, J Biomater Res., Mar. 15, 2000; 49(4): 517-27 Abstract only.

Kim et al., Hybrid Nanofabrication Processes Utilizing Diblock Copolymer Nanotemplate Prepared by Self-assembled Monolayer Based Surface Neutralization, J. Vac. Sci. Technol. B26(1), Jan./Feb. 2008, © 2008 American Vacuum Society, pp. 189-194.

Knoll et al., Phase Behavior in Thin Films of Cylinder-Forming Block Copolymers, Physical Review Letters, vol. 89, No. 3, (Jul. 15, 2002), The American Physical Society, pp. 035501-1 to 035501-4.

Krishnamoorthy et al., Block Copolymer Micelles as Switchable Templates for Nanofabrication, Languir, vol. 22, No. 8, (2006), pp. 3450-3452.

Krishnamoorthy et al., Nanopatterned Self-Assembled Monolayers by Using Diblock Copolymer Micelles as Nanometer-Scale Adsorption and Etch Masks, Advanced Materials, (2008), pp. 1-4.

Krishnamoorthy et al., Nanoscale Patterning with Block Copolymers, Materials Today, vol. 9, No. 9, Sep. 2006, pp. 40-47.

Kuhnline et al., Detecting Thiols in a Microchip Device Using Micromolded Carbon Ink Electrodes Modified with Cobalt Phthalocyanine, Analyst, vol. 131, (2006), pp. 202-207.

Zhang et al., Highly Ordered Nanoporous Thin Films from Cleavable Polystyrene-block-poly(ethylene oxide),Adv. Mater. 2007, 19, pp. 1571-1576.

Zhang et al., Phase Change Nanodot Arrays Fabricated Using a Self-Assembly Diblock Copolymer Approach, Applied Physics Letter, 91, 013104, 2007, American Institute of Physics, pp. 013104 to 013104-3.

Zhao et al., Colloidal Subwavelength Nanostructures for Antireflection Optical Coatings, Optics Letters, vol. 30, No. 14, Jul. 15, 2005, pp. 1885-1887.

Zhou et al., Nanoscale Metal/Self-Assembled Monolayer/Metal Heterostructures, Appl. Phys. Lett., vol. 71, No. 5, Aug. 4, 1997, pp. 611-613.

Zhu et al., Molecular Assemblies on Silicon Surfaces via Si-O Linkages, Langmuir, vol. 16, 2000, American Chemical Society, pp. 6766-6772. [Published on Web Jul. 29, 2000].

Zhu et al., Grafting of High-Density Poly(Ethylene Glycol) Monolayers on Si(111), Langmuir, vol. 17, (2001), pp. 7798-7803.

Ali, H. A., et al., Properties of Self-assembled ZnO Nanostructures, Solid-State Electronics 46 (2002), 1639-1642.

Arshady, R., et al., The Introduction of Chloromethyl Groups into Styrene-based Polymers, 1, Makromol. Chem., vol. 177, 1976, p. 2911-2918.

Asakawa et al., Fabrication of Subwavelength Structure for Improvement in Light-Extraction Efficiency of Light-Emitting Devices Using a Self-Assembled Pattern of Block Copolymer, Applied Optics, vol. 44, No. 34, (Dec. 1, 2005), pp. 7475-7482.

Bae, Joonwon, Surface Modification Using Photo-Crosslinkable Random Copolymers, Abstract submitted for the Mar. 2006 meeting of the American Physical Society, submitted Nov. 30, 2005. (Accessed via the Internet [retrieved on Apr. 15, 2010], URL: http://absimage.aps.org/image/MWS_MAR06-2005-003641.pdf).

Balsara, C., et al, CPIMA, IRG Technical Programs, Synthesis and application of Nanostructured Materials, Leland Stanford Junior Univ., 2006, http://www.stanford.edu/group/cpima/irg/irg_1.htm,.

Bang, J., The Effect of Humidity on the Ordering of Tri-block Copolymer Thin Films, Abstract submitted for the Mar. 2007 meeting of the American Physical Society, submitted Nov. 20, 2006.

Bass, R. B., et al., Microcontact Printing with Octadecanethiol, Applied Surface Science, 226(4), pp. 335-340, Apr. 2004, http://www.ece.virginia.edu/UVML/sis/Papers/rbbpapers/assoct.pdf.

Bearinger, J. P., et al., Chemisorbed Poly(propylene sulphide)-based Copolymers Resist Biomolecular Interactions, Nature Materials 2, 259-264, 2003, (published online Mar. 23, 2003).

Berry, B. C., et al., Orientational Order in Block Copolymer Films Zone Annealed Below the Order—Disorder Transition Temperature,

(56) References Cited

OTHER PUBLICATIONS

Nano Letters vol. 7, No. 9 Aug. 2007, Polymers Division, Nat'l. Inst. of Standards and Technology, Maryland, USA, pp. 2789-2794, (published on Web Aug. 11, 2007).
Berry, B. C., et al., Effects of Zone Annealing on Thin Films of Block Copolymers, National Institute of Standard and Technology, Polymers Division, Maryland, USA, 2007, 2 pages.
Black et al., Integration of Self-Assembled Diblock Copolymers for Semiconductor Capacitor Fabrication, Applied Physics Letters, vol. 79, No. 3, (2001), pp. 409-411.
Black, C .T., et al., Integration of Self Assembly for Semiconductor Microelectronics, IEEE 2005 Custom Integrated Circuits Conference, IBM T.J. Watson Research Center, pp. 87-91.
Black, C. T., Self-aligned self-assembly of multi-nanowire silicon field effect transistors, Appl. Phys. Lett., vol. 87, pp. 163116-1 through 163116-3, 2005.
Black, Polymer Self-Assembly as a Novel Extension to Optical Lithography, ACSNano, vol. 1, No. 3, 2007, American Chemical Society, pp. 147-150.
Black et al., High-Capacity, Self-Assembled Metal-Oxide-Semiconductor Decoupling Capacitors, IEEE Electron Device Letters, vol. 25, No. 9, Sep. 2004, pp. 622-624.
Black et al., Nanometer-Scale Pattern Registration and Alignment by Directed Diblock Copolymer Self-Assembly, IEEE Transactions on Nanotechnology, vol. 3, No. 3, Sep. 2004, pp. 412-415.
Black et al., Self Assembly in Semiconductor Microelectronics: Self-Aligned Sub-Lithographic Patterning Using Diblock Copolymer Thin Films, Proc. of SPIE, vol. 6153, 615302 (2006).
Black et al., Polymer Self Assembly in Semiconductor Microelectronics, IBM J. Res. & Dev. vol. 51, No. 5, Sep. 2007, pp. 605-633.
Botelho et al., Diblock Copolymer Ultrathin Films Studied by High Resolution Electron Energy Loss Spectroscopy, Surface Science, 482-485 (2001), pp. 1228-1234.
Brydson et al. (chapter authors), Generic Methodologies for Nanotechnology: Classification and Fabrication, Nanoscale Science and Technology, John Wiley & Sons, Ltd., (Dec. 20, 2005) (available at http://www3.interscience. wiley.com/cgi-bin/summary/112217550/SUMMARY), pp. 1-55.
Bulpitt et al., New Strategy for Chemical Modification of Hyaluronic Acid: Preparation of Functionalized Derivatives and Their Use in the Formation of Novel Biocompatible Hydrogels, Journal of Biomedical Materials Research, vol. 47, Issue 2, pp. 152-169, Published online Aug. 13, 1999, Abstract only.
Canaria et al., Formation and Removal of Alkylthiolate Self-Assembled Monolayers on Gold in Aqueous Solutions, Lab Chip 6, 289-295 (2006), http://www.rsc.org/publishing/journals/LC/article.asp?doi=b51066c) (Abstract).
Candau et al, Synthesis and Characterization of Polystyrene-poly-(ethylene oxide) Graft Copolymers, Polymer, 1977, vol. 18, pp. 1253-1257.
Cavicchi et al., Solvent Annealed Thin Films of Asymmetric Polyisoprene—Polylactide Diblock Copolymers, Macromolecules 2007, vol. 40, 2007, Univ. of Massachusetts, pp. 1181-1186.
Cha et al., Biomimetic Approaches for Fabricating High-Density Nanopatterned Arrays, Chem. Mater. vol. 19, 2007, pp. 839-843. [Published on Web Jan. 20, 2007].
Chai et al., Assembly of Aligned Linear Metallic Patterns on Silicon, Nature Nanotechnology, vol. 2, (Aug. 2007), pp. 500-506.
Chai et al., Using Cylindrical Domains of Block Copolymers to Self-Assemble and Align Metallic Nanowires, American Chemical Society, www.acsnano.org, (2008), pp. A-M.
Chandekar et al., Template-Directed Adsorption of block Copolymers on Alkanethiol-Patterned Gold Surfaces, (circa 2006), http://www.nano.neu.edu/industry/industry_showcase/industry_day/documents/Chandekar.pdf) (Powerpoint template for scientific posters (Swarthmore College)).
Chang, Li-Wen, Diblock Copolymer Directed Self-Assembly for CMOS Device Fabrication, Proc. of SPIE, vol. 6156, 2006, 615611-1 to 615611-6.
Chang, Li-Wen, Experimental Demonstration of Aperiodic Patterns of Directed Self-Assembly of Block Copolymer Lithography for Random Logic Circuit Layout, IEEE International Electron Devices Meeting (IEDM), paper 33.2, Dec. 6-8, San Francisco, 2010, pp. 33.2.1-33.2.4.
Chen et al., Highly Ordered Arrays of Mesoporous Silica Nanorods with Tunable Aspect Ratios from Block Copolymer Thin Films, Advanced Materials, vol. 20, (2008), pp. 763-767.
Cheng et al., Rapid Directed Self Assembly of Lamellar Microdomains from a Block Copolymer Containing Hybrid, Applied Physics Letters, 91, 143106-143106-3 (2007).
Cheng et al., Self-Assembled One-Dimensional Nanostructure Arrays, Nano Letters, vol. 6, No. 9, 2006, pp. 2099-2103.
Cheng et al., Templated Self-Assembly of Block Copolymers: Effect of Substrate Topography, Adv. Mater. 2003, vol. 15, No. 19, pp. 1599-1602.
Cho et al., Nanoporous Block Copolymer Micelle/Micelle Multilayer Films with Dual Optical Properties, J. Am. Chem. Soc., vol. 128, No. 30, (2006), pp. 9935-9942.
Choi et al., Magnetorheology of Synthesized Core—Shell Structured Nanoparticle, IEEE Transactions on Magnetics, vol. 41, No. 10, Oct. 2005, pp. 3448-3450.
Clark et al., Selective Deposition in Multilayer Assembly: SAMs as Molecular Templates, Supramolecular Science, vol. 4, (1997), pp. 141-146.
Daoulas et al., Fabrication of Complex Three-Dimensional Nanostructures from Self-Assembling Block Copolymer Materials on Two-Dimensional Chemically Patterned Templates with Mismatched Symmetry, Physical Review Letters 96, week ending Jan. 27, 2006, pp. 036104-1-036104-3.
Darling, Directing the Self-assembly of Block Copolymers, Progress in Polymer Science, vol. 32, No. 10, Sep. 28, 2007, pp. 1152-1204.
Desai et al., Engineered Silicon Surfaces for Biomimetic Interfaces, Business Briefing: Medical Device Manufacturing & Technology, 2002.
Edwards et al., Mechanism and Kinetics of Ordering in Diblock Copolymer Thin Films on Chemically Nanopatterned Substrates, Journal of Polymer Science: Part B Polymer Physics, vol. 43, 3444-3459, 2005.
Edwards et al., Precise Control over Molecular Dimensions of Block-Copolymer Domains Using the Interfacial Energy of Chemically Nanopatterned Substrates, Advanced Mater., 16, No. 15, Aug. 4, 2004, pp. 1315-1319.
Elisseeff et al., Photoencapsulation of Chondrocytes in Poly(ethylene oxide)-based Semi-interpenetrating Networks, Journal of Biomedical Materials Research, 51(2): 164-171, Aug. 2000, Abstract only.
Erlandsson et al., Metallic Zinc Reduction of Disulfide Bonds Between Cysteine Residues in Peptides and Proteins, Int'l J. Peptide Res. & Therapeutics, vol. 11, No. 4, (Dec. 2005), pp. 261-265.
Fasolka et al., Block Copolymer Thin Films: Physics and Applications, Annual Reviews Materials Res., vol. 31, (Aug. 2001), pp. 323-355.
Fasolka et al., Morphology of Ultrathin Supported Diblock Copolymer Films: Theory and Experiment, Macromolecules 2000, vol. 33, No. 15, pp. 5702-5712.
Fujita et al., Thin Silica Film with a Network Structure as Prepared by Surface Sol-Gel Transcription on the Poly (styrene-b-4-vinylpyridine) Polymer Film, Chemistry Letters, vol. 32, No. 4, (Dec. 31, 2003), pp. 352-353.
Fukunaga et al., Self-Assembly of Block Copolymer Thin Films Having a Half-Domain-Spacing Thickness: Nonequilibrium Pathways to Achieve Equilibrium Brush Layers Parallel to Substrate, Macromolecules vol. 39, Aug. 2006, pp. 6171-6179.
Gates, Nanofabrication with Molds & Stamps, Materials Today, (Feb. 2005), pp. 44-49.
Gates et al., Unconventional Nanofabrication, Annu. Rev. Mater. Res. 2004, 34:339-72.
Electronegativity—<http://www.princeton.edu/~achaney/tmve/wiki100k/docs/Electronegativity.html> website, visited Aug. 28, 2013, 1 page.

FIG. 2
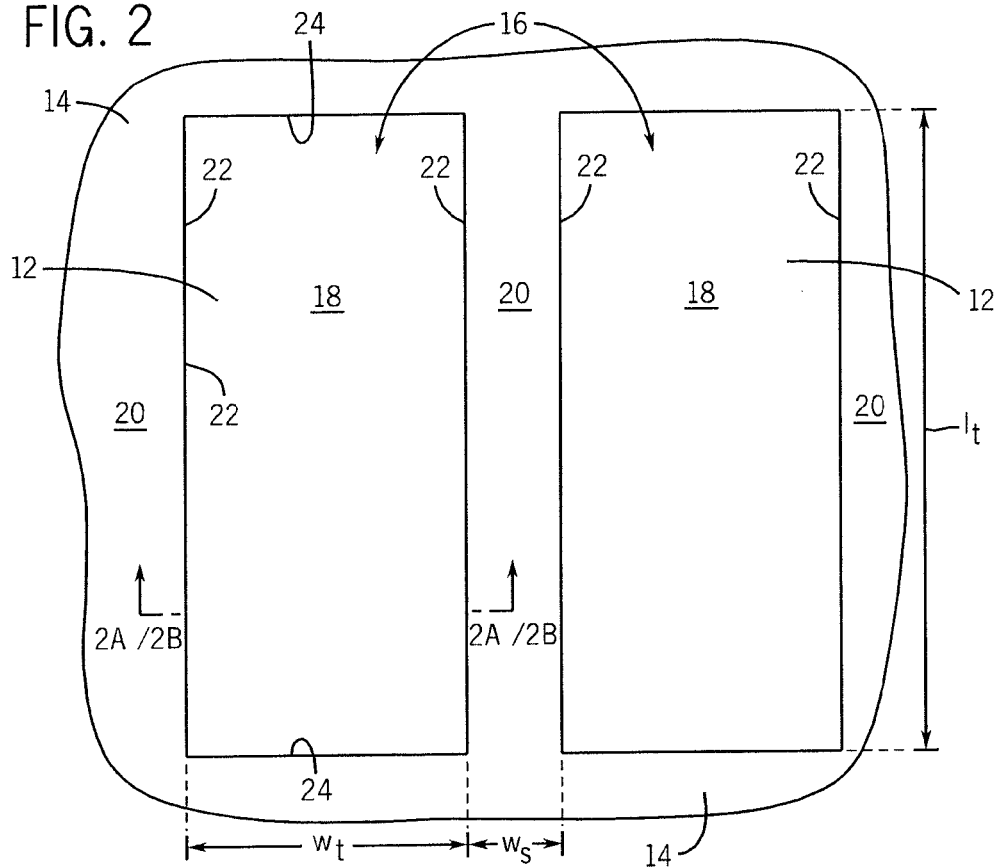
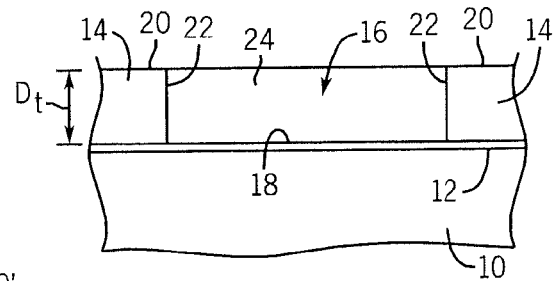
FIG. 2A
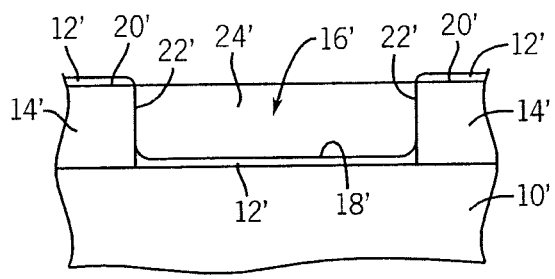
FIG. 2B

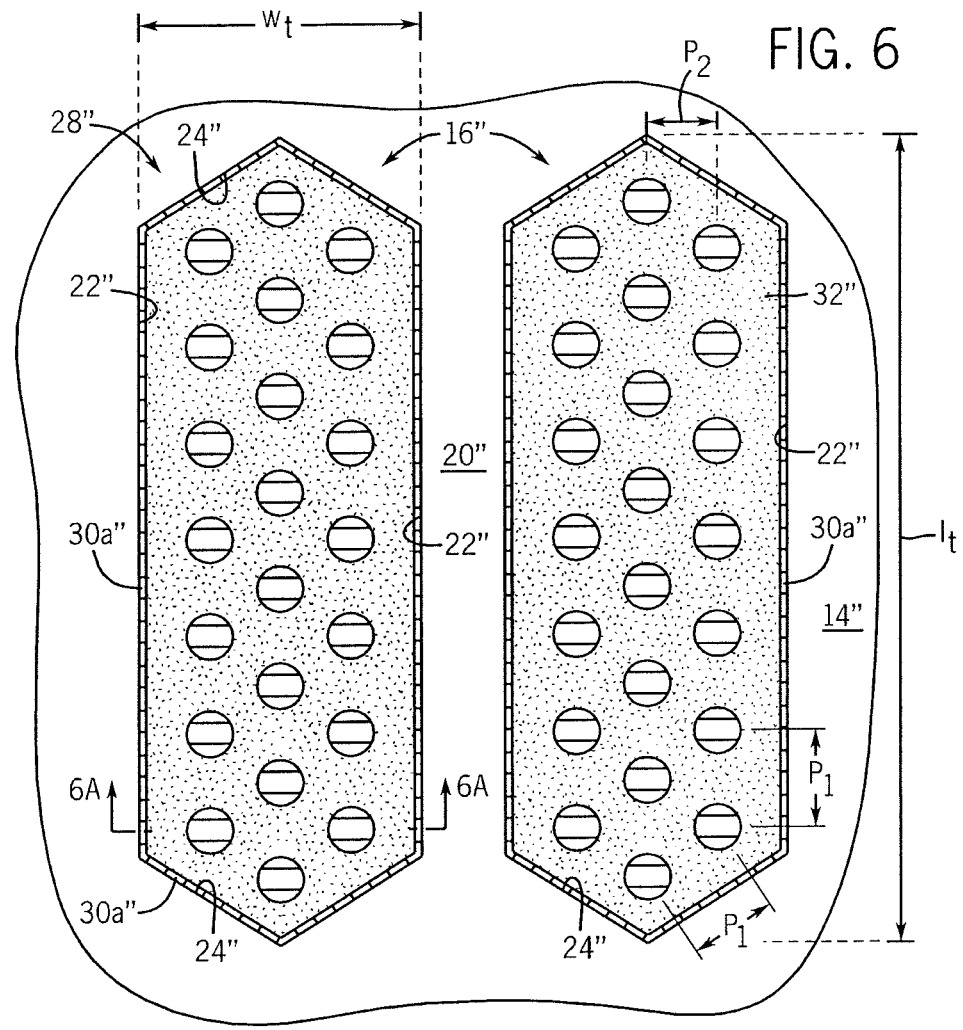
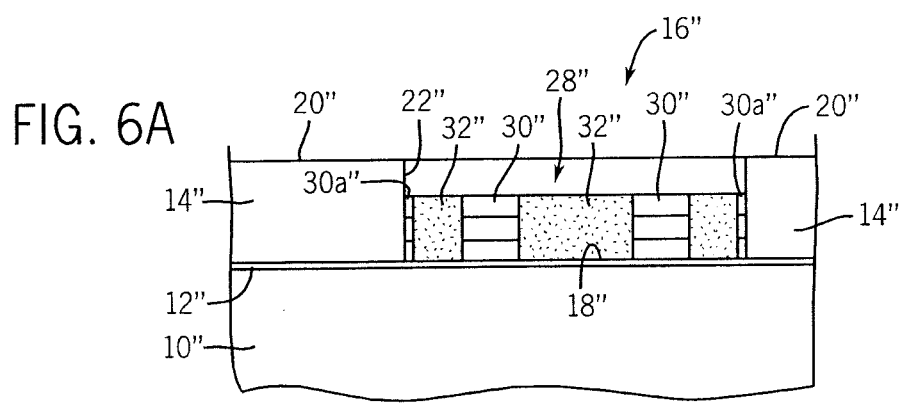

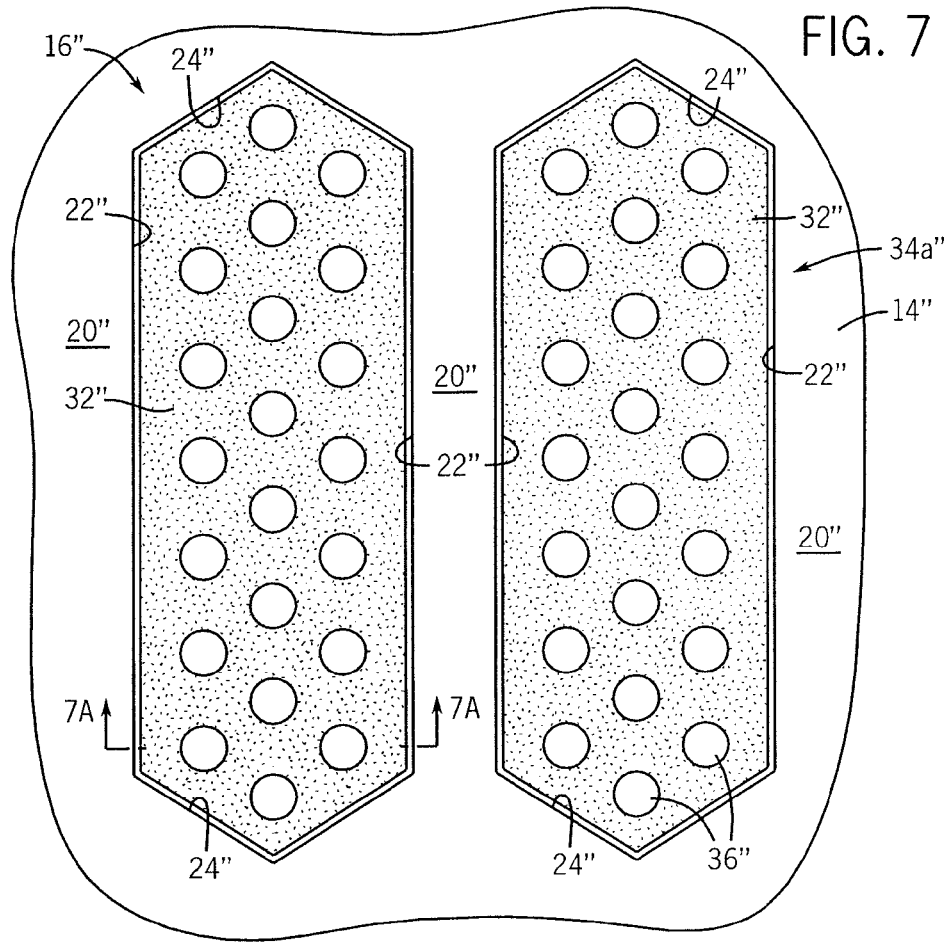
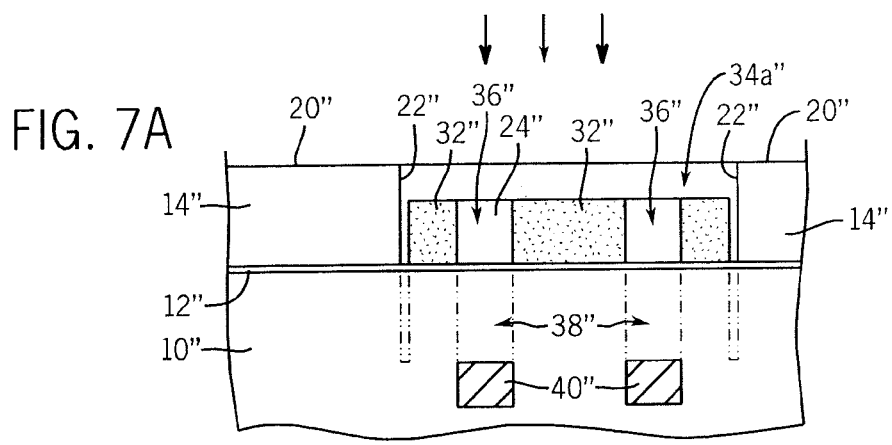

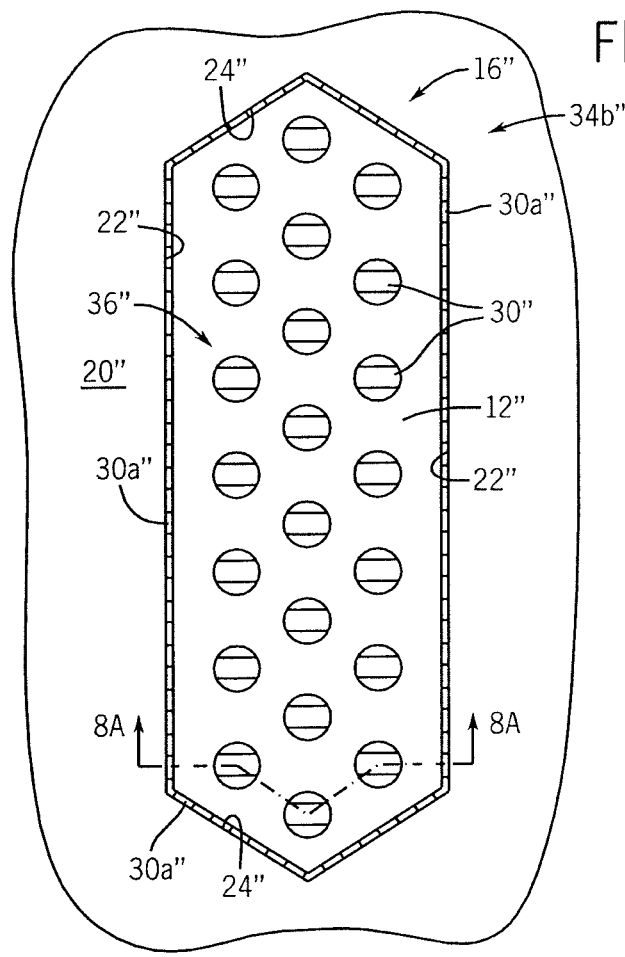
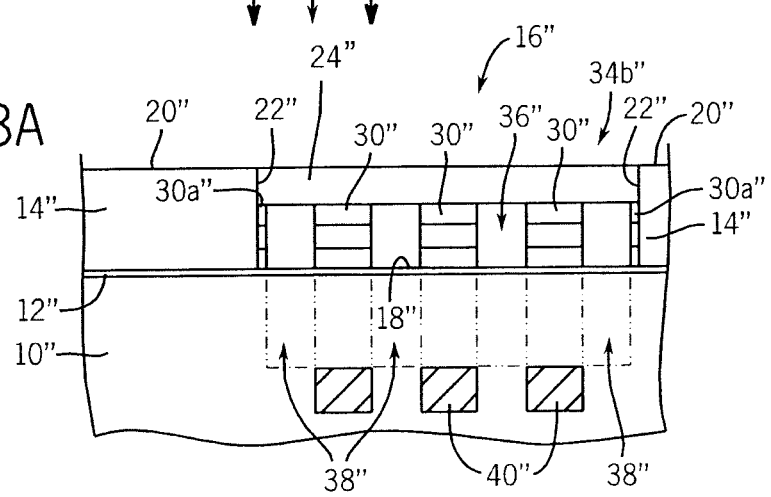

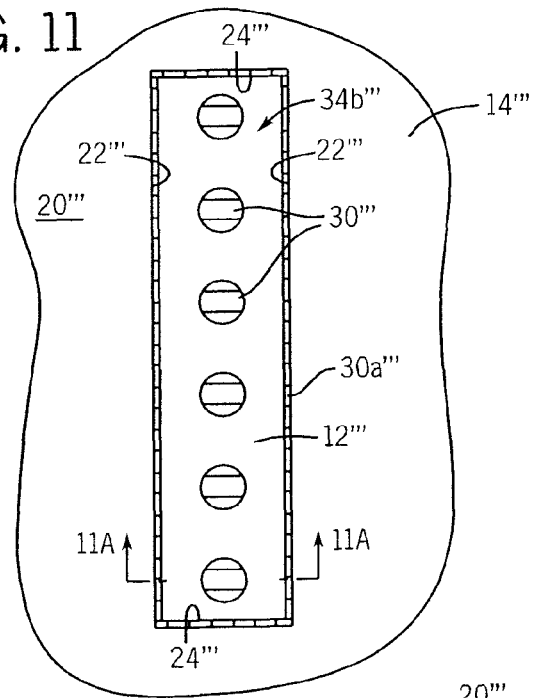
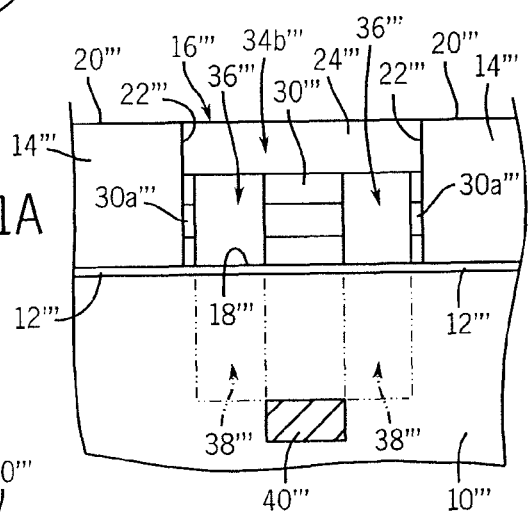
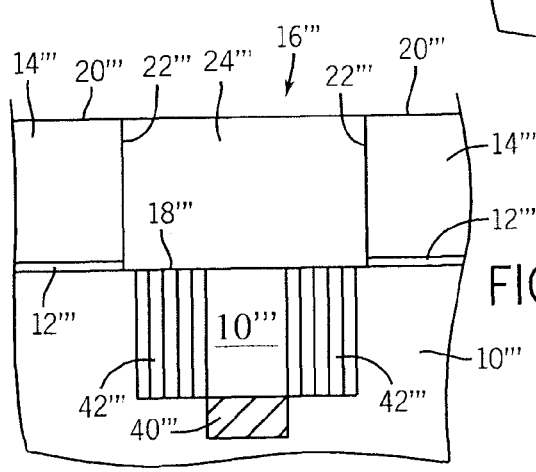

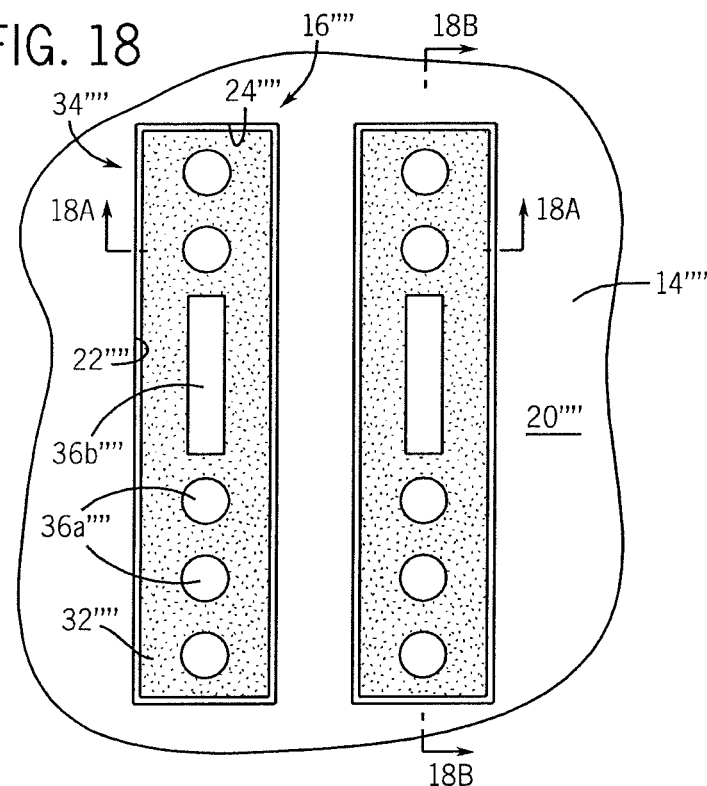
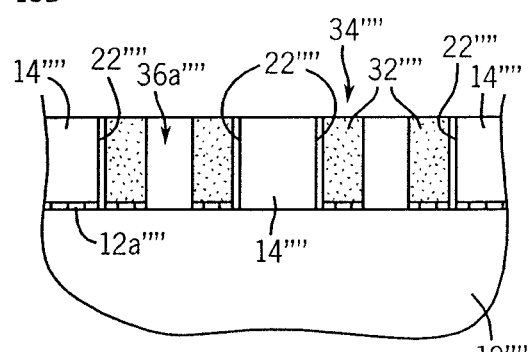
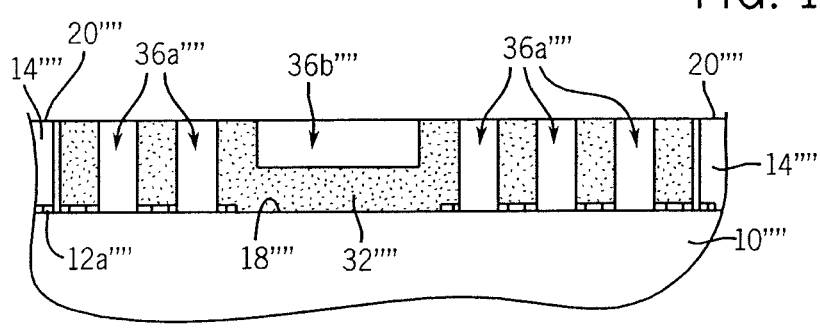

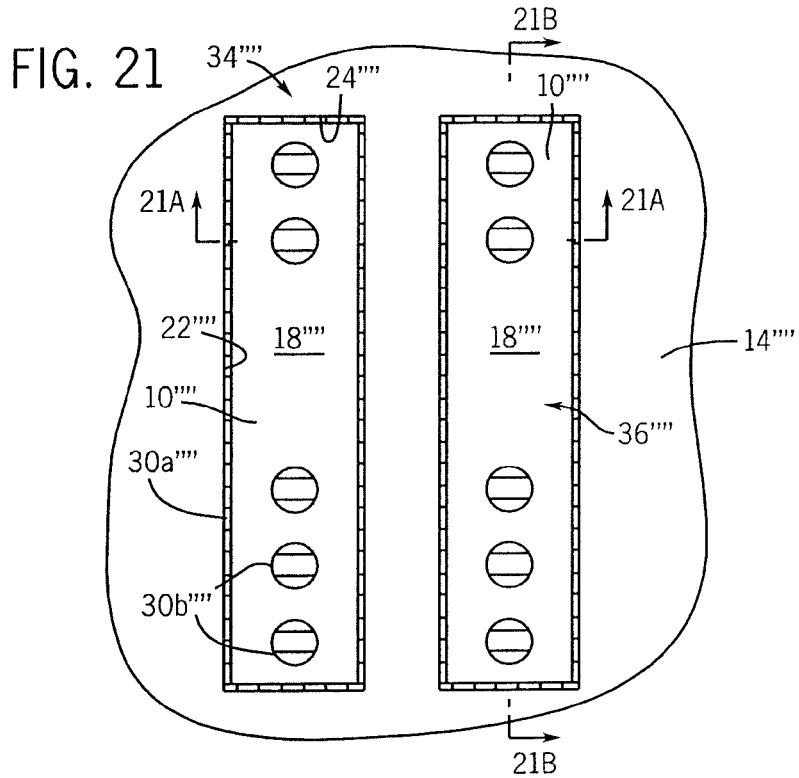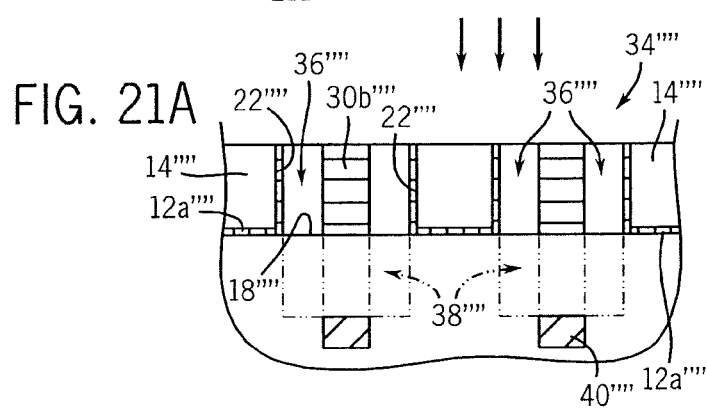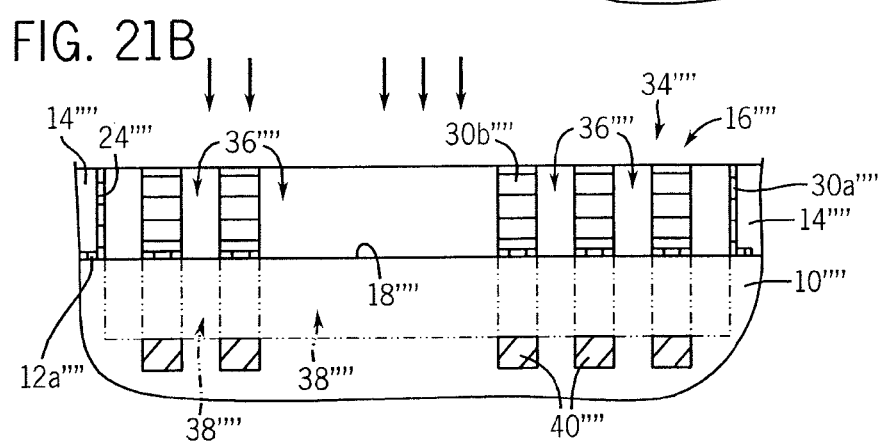

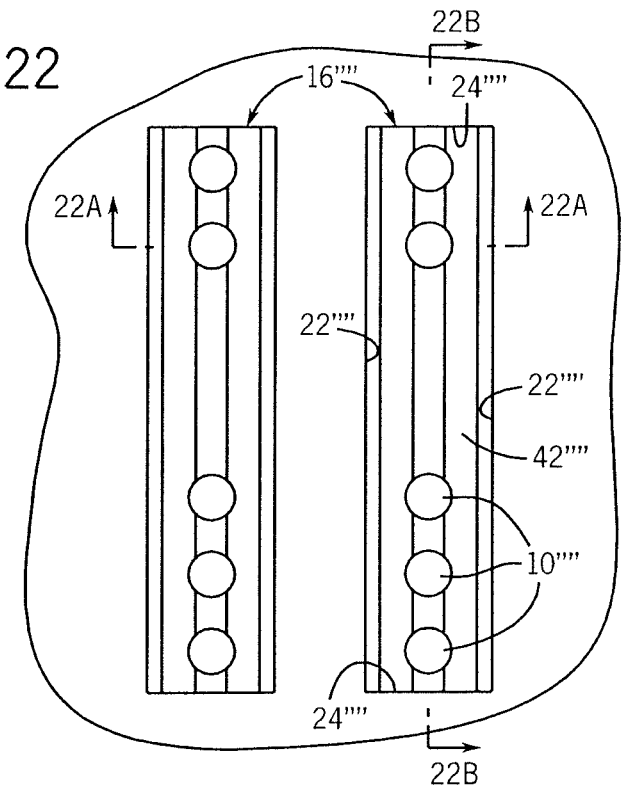
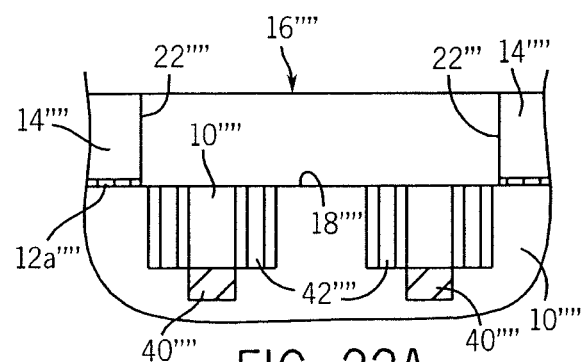
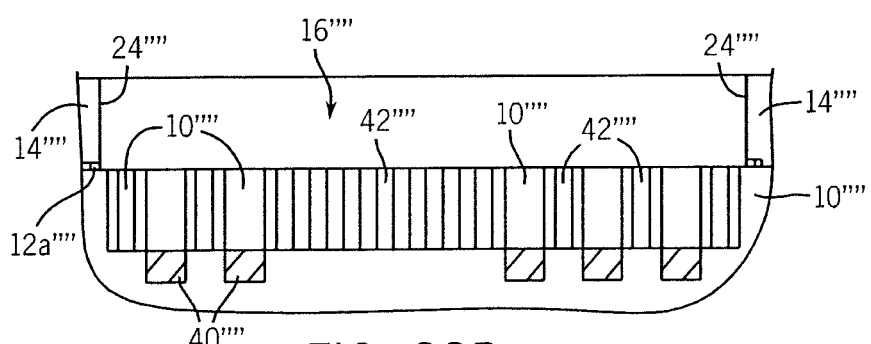

CROSSLINKABLE GRAFT POLYMER NON-PREFERENTIALLY WETTED BY POLYSTYRENE AND POLYETHYLENE OXIDE

CROSS-REFERENCE TO RELATED APPLICATIONS

This application is a divisional of U.S. patent application Ser. No. 13/615,203, filed Sep. 13, 2012, now U.S. Pat. No. 8,513,359, issued Aug. 20, 2013, which is a divisional of U.S. patent application Ser. No. 13/324,216, filed Dec. 13, 2011, now U.S. Pat. No. 8,445,592, issued May 21, 2013, which is a divisional of U.S. patent application Ser. No. 11/765,232, filed Jun. 19, 2007, now U.S. Pat. No. 8,080,615, issued Dec. 20, 2011, the disclosure of each of which is hereby incorporated herein by this reference in its entirety.

TECHNICAL FIELD

Embodiments of the invention relate to methods of fabricating nanoscale arrays of micro-vias, microchannels and microstructures by use of thin films of self-assembling block copolymers, and devices resulting from those methods, including methods and materials for producing neutral wetting surfaces for use in such methods.

BACKGROUND OF THE INVENTION

As the development of nanoscale mechanical, electrical, chemical and biological devices and systems increases, new processes and materials are needed to fabricate nanoscale devices and components. Conventional optical lithographic processing methods are not able to accommodate fabrication of structures and features much below the 100 nm level. The use of self-assembling diblock copolymers presents another route to patterning at nanometer dimensions. Diblock copolymer films spontaneously assemble into periodic structures by microphase separation of the constituent polymer blocks after annealing, for example, by thermal annealing above the glass transition temperature of the polymer or by solvent annealing, forming ordered domains at nanometer-scale dimensions. Following self-assembly, one block of the copolymer can be selectively removed and the remaining patterned film used as an etch mask for patterning nanosized features into the underlying substrate. Since the domain sizes and periods ($L_o$) involved in this method are determined by the chain length of a block copolymer (MW), resolution can exceed other techniques such as conventional photolithography, while the cost of the technique is far less than electron beam lithography or EUV photolithography, which have comparable resolution.

The film morphology, including the size and shape of the microphase-separated domains, can be controlled by the molecular weight and volume fraction of the AB blocks of a diblock copolymer to produce lamellar, cylindrical, or spherical morphologies, among others. Another important factor in the film morphology is the affinity between the diblock copolymer and the underlying surface.

Preferential wetting interfaces tend to direct the morphology of the self-assembled film. Most surfaces have some degree of preferential wetting causing the copolymer material to assemble into lines that are parallel to the surface. However, in some applications, it is desirable to produce structures that are perpendicular to a surface, requiring a neutral wetting surface (equal affinity for both blocks (AB) of the block copolymer to allow both blocks of the copolymer material to wet the surface, and using entropic forces to drive both blocks to wet the neutral wetting surface. However, neutral wetting surfaces are relatively uncommon and often require that the surface of the material layer to be modified to provide a neutral wetting interface.

Neutral wetting surfaces on silicon oxide ($SiO_x$) or silicon nitride (SiN) have been provided by applying a neutral wetting polymer, which is fabricated by adjusting the amount of one monomer to the other, and is wetting to both blocks of a self-assembling (SA) block copolymer. For example, in the use of a diblock copolymer composed of PS-b-PMMA, a PS-r-PMMA random copolymer (60% PS) (which exhibits non-preferential or neutral wetting toward both PS and PMMA blocks and includes a crosslinkable element) has been cast as a film onto $SiO_x$ and crosslinked using UV radiation or thermal processing to form a neutral-wetting mat that loses solubility and adheres to the surface but is not chemically bound or grafted to the surface.

Additional issues arise in the use of cylindrical-phase PS-b-PMMA block copolymers to form self-assembled films whereby, under a typical anneal (at about 180-190° C.), both PS and PMMA blocks wet the air-interface to produce lines of air-exposed half-cylinders that do not completely extend to the underlying substrate. Upon removal of the half-cylinder polymer block (e.g., PMMA) to form an etch mask or template, the underlying polymer matrix (e.g., of PS) must then be etched to expose the underlying substrate to be etched.

A prospective alternate material for forming a self-assembling polymer film is poly(styrene-b-ethylene oxide) (PS-b-PEO) diblock copolymers, which have been shown to be less defect tolerant (i.e., form larger crystalline grains) than PS-b-PMMA with better ordering. Cylinder-forming PS-b-PEO diblock copolymer materials have been used to produce perpendicular oriented and highly ordered, hexagonally close-pitched cylinders that orient perpendicular to surfaces via solvent annealing of the copolymer layer. Solvent annealing caused initial domain segregation at the film-air interface with both polymer blocks wetting the air interface, which was driven downward toward the underlying substrate as the solvent evaporated and the film dried.

However, because the substrate interface is somewhat preferential wetting, a layer of the minority polymer block is formed over the substrate, which prevents the polymer domains from completely extending from the film-air interface to the substrate itself. In addition, the use of solvent annealing to form either perpendicular cylinders or parallel lamella produces the same structure universally over the substrate, which is undesirable in many applications.

It would be useful to provide a method and system for forming self-assembling polymer films such as PS-b-PEO that overcome existing problems.

BRIEF DESCRIPTION OF THE DRAWINGS

Embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIG. 2 illustrates a diagrammatic top plan view of a portion of a substrate at a preliminary processing stage according to an embodiment of the present disclosure, showing the substrate with trenches. FIG. 2A is an elevational, cross-sectional view of the substrate depicted in FIG. 2 taken along line 2A-2A. FIG. 2B is an elevational, cross-sectional view of the substrate depicted in FIG. 2 in another embodiment, taken along line 2B-2B.

FIGS. 3A-5A illustrate elevational, cross-sectional views of embodiments of a portion of the substrate depicted in FIGS. 3-5 taken, respectively, along line 3A-3A to line 5A-5A.

FIG. 6 illustrates a diagrammatic top plan view of a portion of a substrate at a processing stage according to another embodiment of the present disclosure in the fabrication of a self-assembled block copolymer film utilizing a cylindrical-phase block copolymer. FIG. 6A is an elevational, cross-sectional view of the substrate depicted in FIG. 6 taken along line 6A-6A.

FIGS. 7 and 8 illustrate top plan views of the substrate of FIG. 6 at a subsequent processing stage according to embodiments of the disclosure.

FIGS. 7A and 8A illustrate elevational, cross-sectional views of the substrate depicted in FIGS. 7 and 8 taken, respectively, along lines 7A-7A and 8A-8A.

FIGS. 10 and 11 illustrate top plan views of the substrate of FIG. 6 at a subsequent processing stage according to embodiments of the disclosure.

FIGS. 10A and 11A illustrate elevational, cross-sectional views of the substrate depicted in FIGS. 10 and 11 taken, respectively, along lines 10A-10A and 11A-11A.

FIGS. 10B and 11B are views of FIGS. 10A and 11A, respectively, in a subsequent processing stage.

FIGS. 13-18 illustrate diagrammatic top plan views of the substrate of FIG. 12 at subsequent processing stages.

FIGS. 13A-18A illustrate elevational, cross-sectional views of embodiments of a portion of the substrate depicted in FIGS. 13-18 taken, respectively, along line 13A-13A to line 18A-18A.

FIGS. 15B, 17B, and 18B are elevational, cross-sectional views of the substrate of FIGS. 15, 17 and 18 taken along lines 15B-15B, 17B-17B and 18B-18B, respectively.

FIG. 21 is a top plan view of the substrate of FIG. 18 at subsequent processing stage according to another embodiment of the invention. FIGS. 21A and 21B are cross-sectional views of the substrate shown in FIG. 21, taken along lines 21A-21A and 21B-21B, respectively.

FIG. 22 is a top plan view of the substrate of FIG. 21 in a subsequent processing step.

FIGS. 22A and 22B are cross-sectional views of the substrate illustrated in FIG. 22, taken along lines 22A-22A and 22B-22B, respectively.

DETAILED DESCRIPTION OF THE INVENTION

The following description with reference to the drawings provides illustrative examples of devices and methods according to embodiments of the invention. Such description is for illustrative purposes only and not for purposes of limiting the same.

In the context of the current application, the terms "semiconductor substrate" or "semiconductive substrate" or "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

"$L_o$" is the inherent pitch (bulk period or repeat unit) of structures that self-assemble upon annealing from a self-assembling (SA) block copolymer or a blend of a block copolymer with one or more of its constituent homopolymers.

Figure 1:
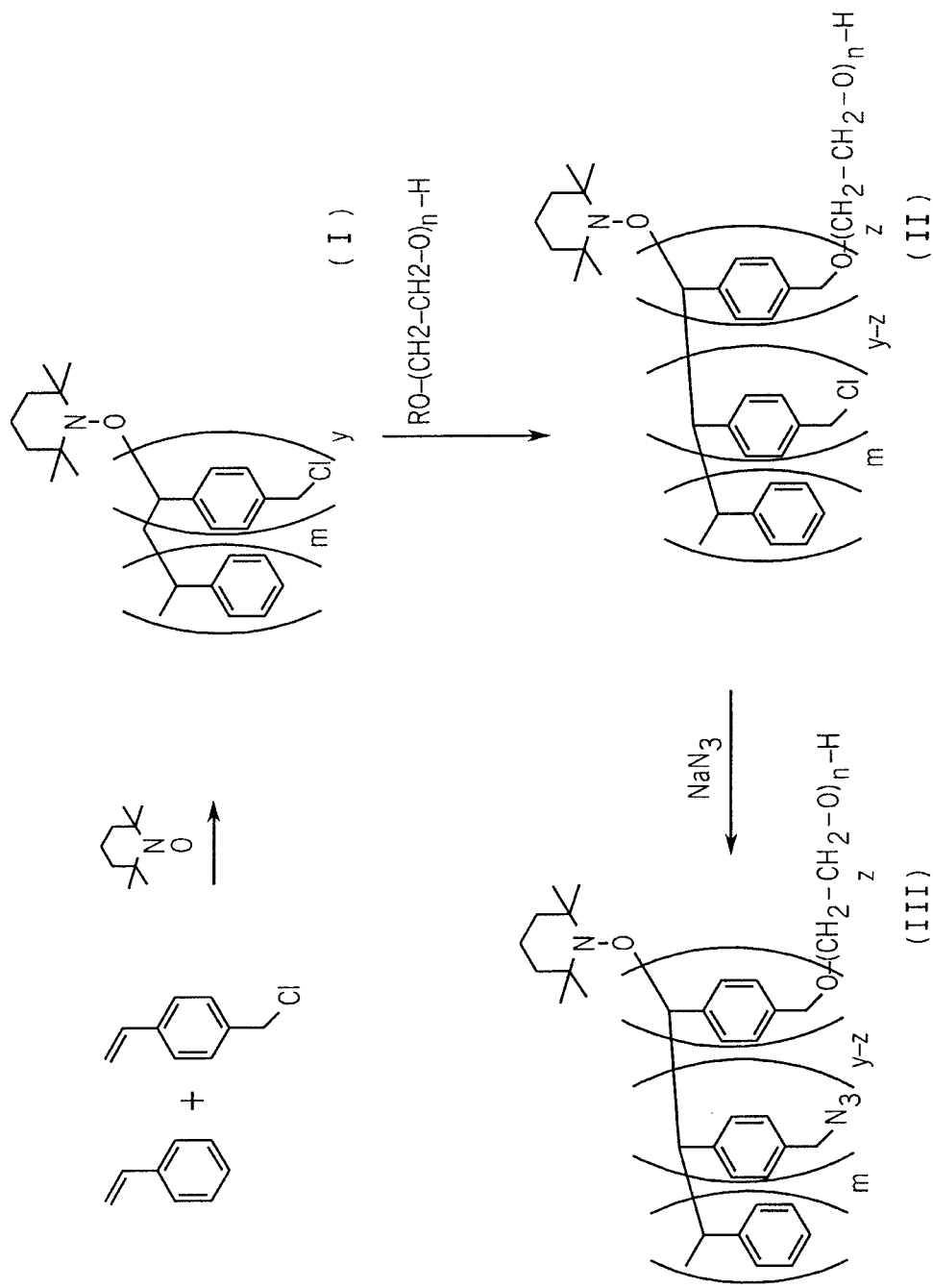
FIG. 1 is a diagram illustrating the reaction for preparing a random copolymer according to an embodiment of the present disclosure.

Steps in a method for synthesizing a crosslinkable graft polymer that is neutrally wetting to polystyrene (PS) and poly(ethylene oxide) (PEO) according to an embodiment of the invention are illustrated in FIG. 1. The resulting random copolymer can be used, for example, to form a crosslinked, insoluble polymer mat that is neutral wetting to a polystyrene/poly(ethylene oxide) block copolymer (PS-b-PEO) for fabricating polymer films composed of ordered domains of the self-assembled polymer blocks.

The random graft copolymer of the invention can be prepared by first polymerizing para-chloromethylstyrene and styrene monomers together to form a random copolymer. In some embodiments, p-chloromethylstyrene comprises the majority (y>50%) of the monomers by weight. In other embodiments, no polystyrene is employed and only p-chloromethylstyrene monomer is used (y=100%), wherein the resultant polymer is a p-chloromethylstyrene homopolymer.

The random copolymer of the invention can be produced, for example, by a free-radical polymerization reaction. Free-radical polymerization is well-known in the art and generally has three stages: initiation, propagation, and termination. Initiation is the formation of an active center (free radical) and generally requires the use of a free-radical initiator. A common type of free-radical initiator is a molecule such as a peroxide (e.g., benzoyl peroxide) or 2,2'-azo-bis-isobutyrylnitrile (AIBN), which decomposes into two or more separate free radicals. The free radical reacts with the vinyl group of a monomer to form a new molecule with the active center on the β-carbon of the former vinyl group. The active center of the new molecule can then react with a series of other monomer molecules in the propagation stage to form a growing polymer chain. The polymerization terminates when two active centers react with each other to form a polymer inactivated to further monomer addition.

Other reactions can, and usually do, occur during the propagation stage. Chief among these reactions are branching, which occurs when the free radical reacts with the middle of a polymer chain to form a side chain, and scission, which occurs when a polymer chain breaks into two or more separate chains. As a result of the random nature of the termination reactions, as well as the branching and scission reactions, the polymer chains formed by a free radical reaction can vary widely in length and weight. This variation of polymer chains is characterized by a broad molecular weight distribution (MWD), also known as polydispersity, which is defined as the ratio of the weight average molecular weight ($M_w$) to the number average molecular weight ($M_n$), or $M_w/M_n$. Frequently, free-radical polymerization produces polymers with an MWD of 3 or more.

In some embodiments, the random copolymer of the invention can also be produced by a controlled/"living" polymerization. In contrast to free-radical polymerization, living polymers tend to have a low polydispersity (MWD). Living polymers are produced by a reversible polymerization reaction that has no termination step. Instead, the polymer and the monomer reach an equilibrium between monomer addition and monomer deletion reactions. Living polymerization processes include, for example, reversible addition fragmentation chain transfer (RAFT) polymerization processes, nitroxide mediated polymerization (NMP) processes, and atom transfer radical polymerization (ATRP) processes.

A RAFT process is a degenerative chain transfer process based on free-radical polymerization. RAFT agents frequently contain thiocarbonyl-thio groups. The polymeric radicals and other radicals react with the C=S bond leading to the formation of transient, stabilized radical intermediates. An NMP process, also known as stable-free radical mediated polymerization (SFRP), is another free radical polymerization using a 2,2,6,6-tetramethylpiperidinyloxy (TEMPO) derivative as the initiator, as further described below. An ATRP process is based on the use of radical polymerization to convert monomers to polymers using an initiator (e.g., an alkyl halide), a catalyst (e.g., a transition metal such as iron or copper complexed by one or more ligands) and a deactivator.

FIG. 1 illustrates an embodiment of a method for producing the random copolymer using a "living" polymer reaction. As depicted, initially a reaction mixture can be formed by combining the monomers para-chloromethylstyrene and styrene (when present) with a polymerization initiator. In some embodiments, the initiator is 1-[TEMPO]ethyl benzene, which will reversibly form TEMPO and an ethyl benzene radical upon heating. The ethyl benzene radical will react with the monomers to sequentially insert the monomers. The polymer chain (I) is reversibly terminated with a TEMPO group at its reactive end when in its non-reactive state. Although not shown, the TEMPO-terminated copolymer (I) is in equilibrium with free TEMPO and non-TEMPO-terminated copolymer.

The copolymer (I) can be prepared using a solution polymerization process or bulk polymerization conditions. In a solution polymerization, the monomers and initiator can be dissolved in a suitable solvent such as toluene. Examples of other potential solvents include, without limitation, xylene, acetylene, propylene glycol, methyl ether, methyl acetate and the like. In a bulk polymerization, the monomers themselves are the reaction solvent, and the reaction can be carried out at atmospheric pressure and moderate temperatures, e.g., about 70° C. Higher or lower pressures and temperatures can be used; such reaction conditions are considered within the scope of this invention.

The copolymer (I) itself precipitates out of the solution by adding the reaction solution to a "poor" solvent such as methanol, allowing easy recovery of the polymer (I). If desired, the recovered copolymer (I) can be washed and dried. The copolymer (I) can then be re-dissolved prior to the grafting reaction.

The resulting copolymer (I) can be reacted with one or more oligomers or polymers of poly(ethylene oxide) (PEO) as shown in FIG. 1, where R is a hydrogen or alkyl group. In some embodiments, the PEO is prepared such that only one end of the poly(ethylene oxide) is nucleophilic. An example of a suitable reagent is monomethoxy poly(ethylene glycol) (MPEG) made reactive by deprotonation of the lone hydroxyl group.

In FIG. 1, the subscripts m and y refer to the number fraction of reactants styrene and p-chloromethylstyrene, respectively, based on the total number of all such reactants that are incorporated into the polymer, i.e., where m+y=100%. The subscript z is the number fraction of the total number of mers that are grafted with PEO. The amount z of PEO oligomers or polymer chains used in the grafting reaction is selected such that the resulting material can be cast to provide a surface that is neutral, or non-preferential, wetting to both polystyrene (PS) and to PEO, e.g., both PS and PEO have identical interfacial energies on a film of the polymer material. The hydroxyl group of the ethylene oxide oligomer/polymer reacts to displace the chlorine atom from the chloromethyl group of the polymer with units derived from p-chloromethylstyrene to form a graft polymer (II). In particular, the amount of PEO oligomers/polymers chains is selected to be less than the number of chlorine atoms available on the chloromethyl moieties. As such, some chlorine atoms will remain on the graft polymer (II) for reactions to attach the crosslinking functional groups.

The grafting reaction is conveniently carried out in solution. Organic solvents, such as toluene, are appropriate solvents for this grafting reaction. The grafting reaction can be carried out at atmospheric pressure and moderate temperatures, e.g., about 70° C. Higher or lower pressures and temperatures can be used and such reaction conditions are considered within the scope of this invention.

The graft copolymer (II) is then reacted to attach azide crosslinking groups to the polymer chain to form an azide-functionalized polymer (III). For example, the grafted copolymer can be reacted with sodium azide ($NaN_3$), as shown in FIG. 1, which reacts to displace the remaining chlorine atom from the chloromethyl group of the polymer with units derived from p-chloromethylstyrene. Suitable azide having the characteristic formula $R(N_3)_x$ can be used in place of the sodium azide, where x>zero (0) and R is a metal atom other than sodium, a hydrogen atom or an ammonium radical. A stoichiometric excess of the azide group (e.g., sodium azide) can be used to completely displace all the chlorine atoms still present on the polymer chains and maximize the number of crosslinking moieties. Reaction conditions for attaching the azide groups can be similar to the previous reaction conditions for polymerization and/or for grafting.

The resulting azide-functionalized graft copolymer (III) can be purified, if desired, by a conventional method. One such method is to precipitate the polymer (III) from solution, e.g., by adding to a "poor" solvent such as methanol, wash the precipitate, and dry the precipitate under low temperatures (e.g., less than or equal to about 100° C.).

The azidomethyl groups serve as crosslinking moieties, which can be activated either thermally (by heating) or photolytically (by exposure to ultraviolet (UV) light) to initiate crosslinking reactions of the azido functional groups and form crosslinked films of poly(styrene-g-ethylene oxide-r-para-azidomethylstyrene) (PS-g-PEO-g-p-azidomethylstyrene, or PS-r-PEO). The random polymers are designed to interact with both blocks of a self-assembling PEO-b-PS diblock copolymer. The molecular weight (MW) of the random polymers is generally at about 30,000-50,000. An example of a random copolymer can comprise about 20-80% PEO, about 80-20% PS (including grafted segments) and about 1-5% of azidomethylstyrene. Thin films of the resulting polymers can be cast onto a substrate and fixed in place by thermally or photolytically crosslinking the polymers to form a mat that is neutral wetting to PS and PEO and insoluble due to the crosslinking. The ability to photolytically crosslink the random polymer allows for patterning of the polymer layer and registration of a PS-b-PEO film that is cast and annealed onto the substrate bearing the patterned mat.

Films of PS-b-PEO can be coated on a substrate bearing a layer (mat) composed of the crosslinked, neutral wetting random PS-r-PEO polymer of the invention and, upon annealing, the PS-b-PEO film will self-assemble into morphologies that are oriented in response to the neutral wetting properties of the crosslinked random polymer mat. For example, annealing a cylinder-phase PS-b-PEO film will orient the cylinders perpendicular to the substrate bearing the crosslinked polymer mat.

Processing conditions of embodiments of the invention use a graphoepitaxy technique utilizing the sidewalls of trenches as constraints to induce orientation and registration of a film of a self-assembling diblock copolymer to form an ordered array pattern registered to the trench sidewalls. In some embodiments, selective removal of one of the polymer domains can be performed to produce a template that can be used as a mask to etch features in an underlying substrate.

Steps in a method for using the random graft PS-r-PEO copolymer of the invention for fabricating a thin film from a self-assembling (SA) PS-b-PEO block copolymer that defines nanometer-scale linear array patterns according to embodiments of the invention are illustrated in FIGS. 2-5.

In the described embodiment, a lamellar-phase PS-b-PEO block copolymer film is deposited onto a layer of the described random graft copolymer, which provides a surface that is neutral wetting to both PS and PEO (exhibits non-preferential wetting toward PS and PEO). Upon annealing, the block copolymer film self-assembles to form a registered and lamellar array of alternating polymer-rich blocks (PS and PEO) that extend the length of the trench and are oriented perpendicular to the trench floor and parallel to the sidewalls.

To produce a lamellar polymer film within the trenches using a lamellar-phase PS-b-PEO block copolymer, the surface of the sidewalls and edges of the trenches are preferential wetting by one block of the copolymer and the trench floors are neutral wetting (equal affinity for both blocks of the copolymer) to allow both blocks of the copolymer material to wet the floor of the trench. Entropic forces drive the wetting of a neutral wetting surface by both blocks, resulting in the formation of a layer of perpendicular lamellae across the width of each trench.

In an embodiment shown in FIGS. 2 and 2A, a layer 12 of the PS-r-PEO random copolymer of the invention has been formed on a substrate 10 prior to forming an overlying material layer 14. The substrate 10 can be composed, for example, of silicon, silicon oxide, silicon nitride, silicon oxynitride, silicon oxycarbide, among other materials.

A solution of the azidomethylstyrene-functionalized random copolymer (PS-r-PEO) in a solvent such as toluene, xylene, chloroform, and benzene, among others, in which both monomers are soluble (e.g., about 1% w/v solution) can be applied as a layer 12 onto the substrate 10 to a thickness of about 1-100 nm, for example, by spin-coating. The random copolymer is cast to a minimum thickness such that the block PS-PEO cast above the random copolymer layer will entangle without contacting the underlying substrate. The PS-r-PEO random copolymer can then be UV crosslinked (e.g., 1-5 MW/cm$^2$ exposure for about 15 seconds to about 30 minutes) or thermally crosslinked (e.g., at about 170° C. for about 4 hours), whereupon the copolymer forms a crosslinked mat on the surface of the substrate 10.

A material layer 14 can then be formed over the crosslinked PS-r-PEO random copolymer layer 12 and etched to form trenches 16 to expose the layer 12 as a neutral wetting surface on a floor or bottom surface 18 of the trench 16. The trenches 16 are structured with opposing sidewalls 22, opposing ends 24, a width ($w_t$), a length ($l_t$) and a depth ($D_t$). Adjacent trenches are separated by a spacer (or crest) 20. The trenches can be formed using a lithographic tool having an exposure system capable of patterning at the scale of $L_o$ (10-100 nm). Such exposure systems include, for example, extreme ultraviolet (EUV) lithography, proximity X-rays and electron beam (e-beam) lithography, as known and used in the art. Conventional photolithography can attain (at smallest) about 58 nm features.

Referring now to FIG. 2B, in another embodiment, the material layer 14' can be formed on the substrate 10' and etched to form the trenches 16', and the neutral wetting random copolymer can then applied to the trench floors 18'. For example, the random copolymer can be cast or spin coated as a blanket film over the material layer 14' and into the trenches, and then photo-exposed through a mask or reticle (not shown) to selectively crosslink the random copolymer only within the trenches to form the neutral wetting layer 12'. Non-crosslinked random copolymer material outside the trenches (e.g., on the spacers 20') can be subsequently removed.

A self-assembling (SA) lamellar-phase diblock copolymer material is then deposited into the trenches and processed such that the copolymer material will self-assemble to form a lamellar film composed of perpendicular-oriented, alternating polymer-rich blocks across the width of the trench. In the illustrated example, the diblock copolymer is a poly(styrene-block-ethylene oxide) (PS-b-PEO) block copolymer.

The trench sidewalls, edges and floors influence the self-assembly of the polymer blocks and the structuring of the array of nanostructures within the trenches. The trench sidewalls 22 and ends 24 are structured to be preferential wetting by one block of the block copolymer to induce registration of lamellae as the polymer blocks self-assemble. The material layer 14 defining the trench surfaces can be a material that is inherently preferential wetting to one of the blocks, or in other embodiments, a layer of a preferential wetting material can be applied onto the surfaces of the trenches. For example, in the use of a PS-b-PEO block copolymer, in some embodiments, the material layer 14 can be composed of silicon (with native oxide), oxide (e.g., silicon oxide, $SiO_x$) or other inorganic films, for example, which exhibits preferential wetting toward the PEO block to result in the assembly of a thin (e.g., ¼ pitch) interface layer of PEO and alternating PEO and PS lamellae (e.g., ½ pitch) within each trench in the use of a lamellar-phase block copolymer material.

The boundary conditions of the trench sidewalls in both the x- and y-axis impose a structure wherein each trench contains "n" number of lamellae. Factors in forming a single array or layer of nanostructures within the trenches include the width and depth of the trench, the formulation of the block copolymer to achieve the desired pitch ($L_o$), and the thickness (t) of the copolymer film.

The trenches 16 are constructed with a width ($w_t$) such that a block copolymer (or blend) will self-assemble upon annealing into a single layer of n lamellae spanning the width ($w_t$) of the trench, with the center-to-center distance of adjacent lamellae being at or about $L_o$. In using a lamellar-phase block copolymer, the width ($w_t$) of the trenches is a multiple of the inherent pitch value ($L_o$) of the polymer being equal to or about $nL_o$ ("n*$L_o$"), typically ranging from about n*10 to about n*100 nm (with n being the number of features or structures). The application and annealing of a lamellar-phase block copolymer material having an inherent pitch value of $L_o$ in a trench having a width ($w_t$) at or about $L_o$ will result in the formation of a single layer of n lamellae spanning the width and registered to the sidewalls for the length of the trench. In some embodiments, the trench dimension is about 50-500 nm wide ($w_t$) and about 1,000-10,000 µm in length ($l_t$), with a depth ($D_t$) of about 50-500 nm.

Figure 3:
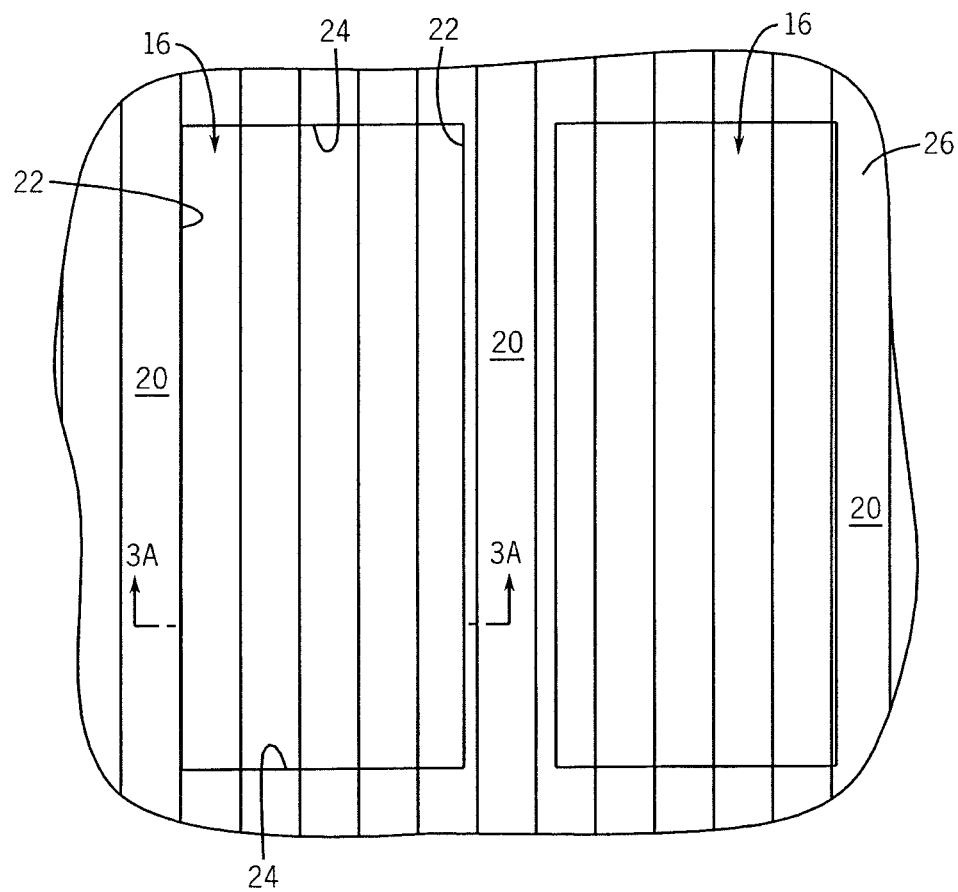
FIGS. 3-5 illustrate diagrammatic top plan views of the substrate of FIG. 2 at various stages of the fabrication of a self-assembled block copolymer film according to an embodiment of the present disclosure.
Figure 3A:
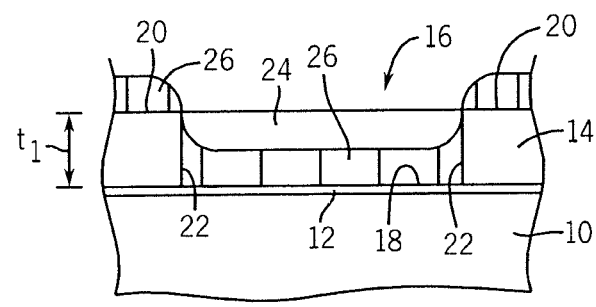

Referring now to FIGS. 3 and 3A, a layer 26 of a self-assembling lamellar-phase PS-b-PEO diblock copolymer material having an inherent pitch at or about $L_o$ (or a ternary blend of block copolymer and homopolymers blended to have a pitch at or about $L_o$) is deposited, typically by spin casting (spin-coating) onto the floor 18 of the trenches 16. The PS-b-PEO block copolymer material can be deposited, for example, by spin casting a dilute solution (e.g., about 0.25-2 wt % solution) of the PS-b-PEO copolymer in an organic solvent such as dichloroethane ($CH_2Cl_2$), toluene or chloroform, for example.

The thickness ($t_1$) of the PS-b-PEO diblock copolymer layer 26 and at or about the $L_o$ value of the PS-b-PEO copolymer material such that the film layer 26 will self-assemble upon annealing to form a single layer of lamellae across the width ($w_t$) of the trench. In some embodiments, the trench depth ($D_t$) is greater than the film thickness ($t_1$). A typical thickness ($t_1$) of a lamellar-phase PS-b-PEO block copolymer film 26 is about ∀20% of the $L_o$ value of the copolymer (e.g., about 10-100 nm) to form alternating polymer-rich lamellar blocks having a width of about 0.5 $L_o$ (e.g., 5-50 nm) within each trench. In the use of a solvent anneal, the film can be much thicker than $L_o$, e.g., up to about +1000% of the $L_o$ value. The thickness of the film 26 can be measured, for example, by ellipsometry techniques. As shown, a thin film 26 of the block copolymer material can be deposited onto the spacers 20 of the material layer 14; this film will form a monolayer of lamellae in a parallel orientation with no apparent structure from a top-down (etching) perspective.

The volume fractions of the two blocks (AB) of the PS-b-PEO diblock copolymer are generally at a ratio between about 50:50 and 60:40. An example of a lamellae-forming symmetric diblock copolymer is PS-b-PEO with a weight ratio of about 50:50 (PS:PEO) and total molecular weight ($M_n$) of about 19 kg/mol. Although PS-b-PEO diblock copolymers are used in the illustrative embodiments of this disclosure, triblock or multiblock copolymers can also be used.

The PS-b-PEO block copolymer material can also be formulated as a binary or ternary blend comprising a PS-b-PEO block copolymer and one or more homopolymers (i.e., polystyrene (PS) and polyethylene oxide (PEO) to produce blends that swell the size of the polymer domains and increase the $L_o$ value of the polymer. The volume fraction of the homopolymers can range from 0 to about 40%. An example of a ternary diblock copolymer blend is a PS-b-PEO/PS/PEO blend. The $L_o$ value of the polymer can also be modified by adjusting the molecular weight of the block copolymer, e.g., for lamellae, $L_o \sim (MW)^{2/3}$.

Figure 4:
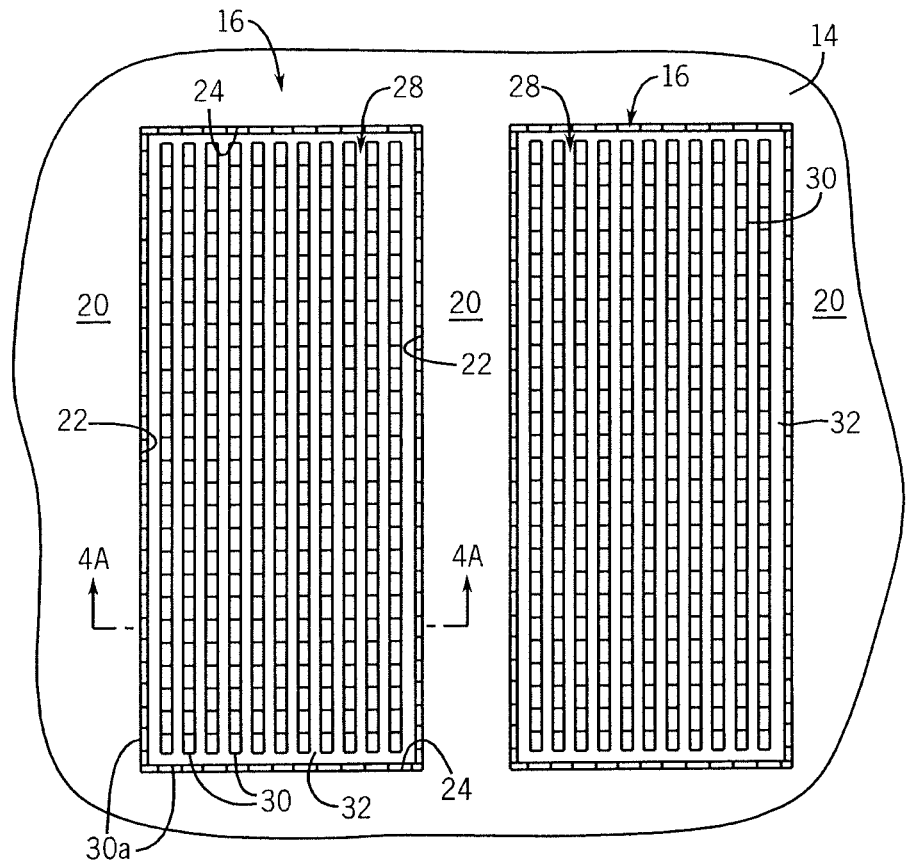
Figure 4A:
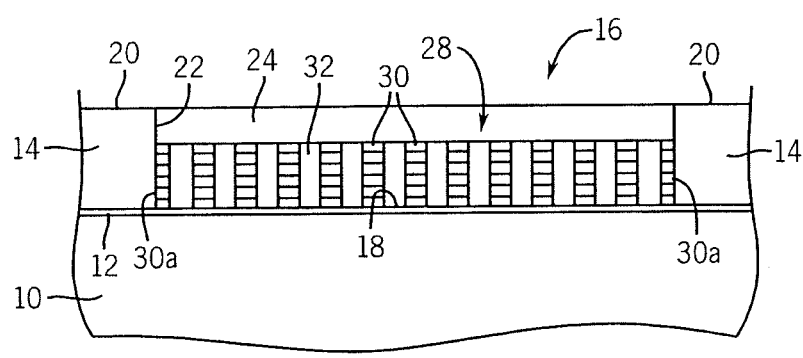

Referring now to FIGS. 4 and 4A, the PS-b-PEO block copolymer film 26 is then annealed to cause the polymer blocks to phase separate and self-assemble according to the preferential and neutral wetting of the trench surfaces 18, 22, 24 to form a self-assembled polymer film 28.

In some embodiments, the film 26 can be solvent annealed. In a solvent anneal, the film is swollen by exposure to a vapor of a "good" solvent for both blocks and then removal of the vapor. Vapors of a solvent such as benzene, chloroform or a chloroform/octane mixture, for example, can be exposed to the film 26 to slowly swell both blocks (PS, PEO) of the film. The solvent and solvent vapors are then allowed to slowly evaporate to dry the film, resulting in self-assembled lamellar domains oriented perpendicular to the substrate 10. The presence of the neutral wetting PS-r-PEO random block copolymer layer 12 over the surface of the substrate 10 on the floors 18 of the trenches allows the self-assembling polymer domains to extend completely from the film-air interface to the substrate surface (trench floors 18).

The PS-PEO copolymer film can also be thermally annealed at the annealing temperature (e.g., about 150-250° C.) in an atmosphere that is saturated (but not supersaturated) with a solvent in which both blocks are soluble. The solvent-saturated vapor maintains a neutral air interface in conjunction with the surface interface with the neutral wetting random copolymer layer 12. The existence of both neutral wetting air and surface interfaces induces the formation of perpendicular features throughout the film by thermal annealing over regions coated with the neutral-wetting random copolymer of the invention.

The constraints provided by the width ($w_t$) of the trenches and the character of the copolymer composition combined with preferential or neutral wetting surfaces within the trenches result, upon annealing, in a single layer of n lamellae across the width ($w_t$) of the trench. The number "n" or pitches of lamellar blocks within a trench is according to the width ($w_t$) of the trench and the molecular weight (MW) of the PS-r-PEO block copolymer. As shown in FIG. 4A, lamellar-phase block copolymer material will, upon annealing, self-assemble into a film 28 composed of perpendicular-oriented, alternating polymer-rich blocks 30, 32 spanning the width ($w_t$) of the trench 16 at an average pitch value at or about $L_o$. For example, depositing and annealing an about 50:50 PS:PEO block copolymer film (e.g., $M_n$=19 kg/mol; $L_o$=19 nm) in an about 250 nm wide trench will subdivide the trench into about 12 lamellar pitches. The resulting morphology of the annealed film 28 (i.e., perpendicular orientation of lamellae) can be examined, for example, using atomic force microscopy (AFM), transmission electron microscopy (TEM), scanning electron microscopy (SEM).

Optionally, the annealed and ordered film 28 can then be treated to crosslink the polymer segments to fix and enhance the strength of the self-assembled polymer blocks 30, 32 within the trench 16 (e.g., to crosslink the PS segments). The polymers can be structured to inherently crosslink (e.g., upon exposure to ultraviolet (UV) radiation, including deep ultraviolet (DUV) radiation), or one or both of the polymer blocks of the copolymer material can be formulated to contain a crosslinking agent. Optionally, the material 26 outside the trench (e.g., on spacer 20) can then be removed as shown. If the material layer 12 is a hard mask (e.g., not etched) relative to etching of substrate to at a later step, the removal of material 26 outside the trench is not necessary.

For example, in one embodiment, the trench regions can be selectively exposed through a reticle (not shown) to crosslink only the self-assembled film 28 within the trench 16, and a wash can then be applied with an appropriate solvent (e.g., toluene) to remove the non-crosslinked portions of the film 28 (e.g., material 26 on the spacer 20) leaving the registered self-assembled film within the trench and exposing the surface of material layer 14 above/outside the trench (e.g., the spacer 20). In another embodiment, the annealed film 28 can be crosslinked globally, a photoresist layer can be applied to pattern and expose the areas of the film outside the trench regions (e.g., over the spacers 20), and the exposed portions of the film can be removed, for example by an oxygen ($O_2$) plasma treatment. In other embodiments, the spacers 20 are narrow in width, for example, a width ($w_s$) of one of the copolymer domains (e.g., about $L_o$) such that the material 26 on the spacers is minimal and no removal is required.

Figure 5:
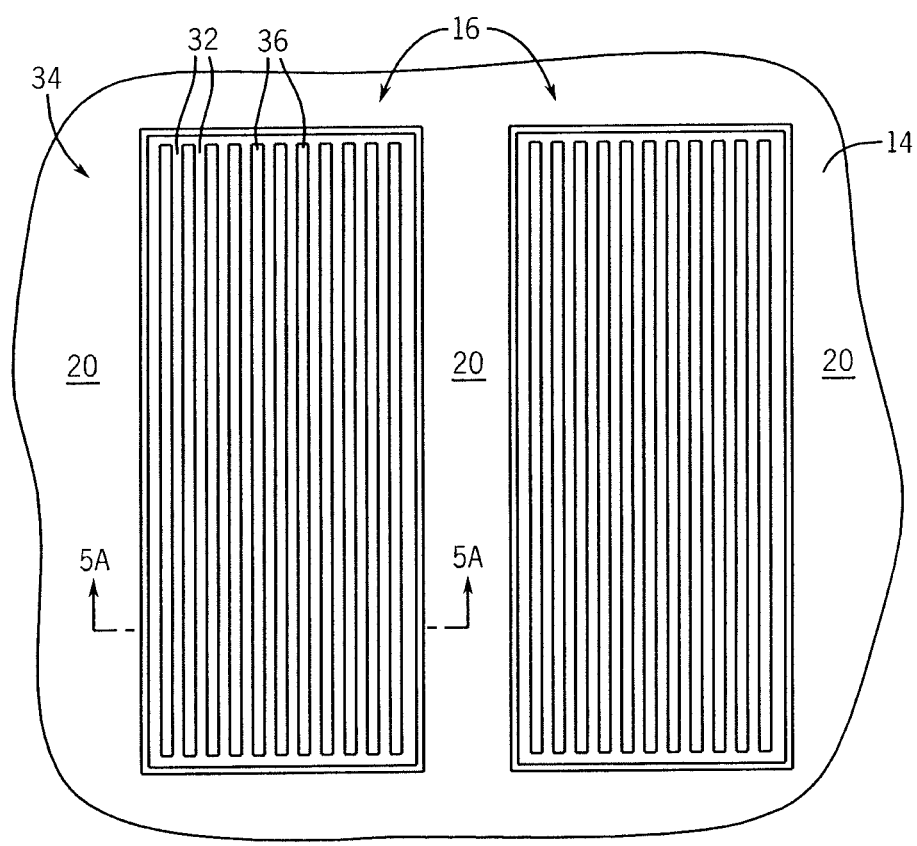
Figure 5A:
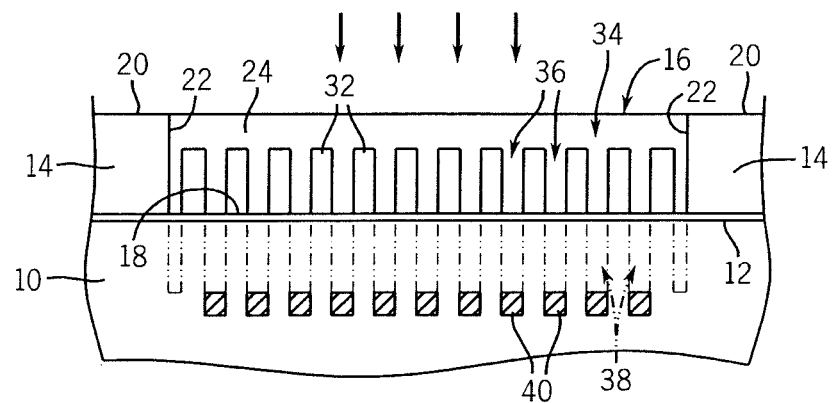

Referring now to FIGS. 5 and 5A, one of the block components can be selectively removed to produce a thin film 34 that can be used, for example, as a lithographic template or mask to pattern the underlying substrate 10 in a semiconductor processing to define regular patterns in the nanometer size range (i.e., about 10-100 nm).

For example, selective removal of PEO domains 30 will result in openings (slits) 36 separated by vertically oriented walls composed of PS domains 32, and the neutral wetting PS-r-PEO random copolymer layer 12 exposed on the trench floor 18. Removal of the water-soluble PEO phase domains can be performed, for example, by exposure of the film to aqueous hydroiodic acid or exposure to water alone, which will draw PEO to the surface without cleaving the bonds to the PS domains. In embodiments in which the PS-b-PEO block copolymer includes an acid-cleavable linker (e.g., trityl alcohol linker) positioned between the polymer blocks, exposure of the film to an aqueous acid (e.g., trifluoroacetic acid) or to an acid vapor can be performed to cleave the polymer into PEO and PS fragments (S. Yurt et al., "Scission of Diblock Copolymers into Their Constituent Blocks," *Macromolecules* 2006, 39, 1670-1672). Rinsing with water can then be performed to remove the cleaved PEO domains. In other embodiments, exposure to water to draw the PEO domains to the surface followed by a brief oxygen ($O_2$) plasma etch can also be performed to remove the PEO domains on the surface of the film to form voids and reveal underlying PS domains.

In embodiments in which the PS phase domains 32 are removed, the openings (slits) 36 are separated by walls composed of the PEO domains 30.

In some embodiments, the resulting film 34 has a corrugated surface that defines a linear pattern of fine, nanometer-scale, parallel slits (openings) 36 about 5-50 nm wide and several microns in length (e.g., about 10-4000 μm), the individual slits separated by walls (e.g., of block 32) about 5-50 nm wide, providing an aspect ratio ranging from about 1:2 to about 1:20. For example, removal of the PEO domains affords a PS mask of sublithographic dimensions, for example, a pitch of about 35 nm (17.5 nm PS domain). A smaller pitch can be dialed in by using lower molecular weight diblock copolymers.

Figure 5B:
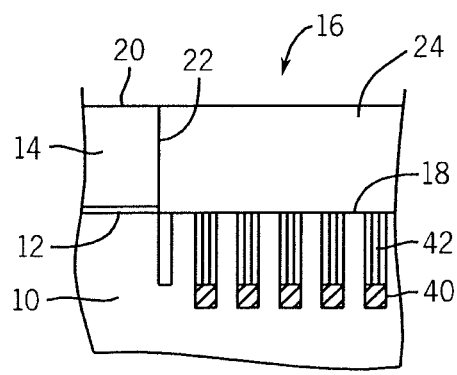
FIG. 5B is a view of a portion of FIG. 5A in a subsequent processing step.

The films can be used, for example, as a lithographic template or etch mask to pattern (arrows ↓↓) the underlying substrate 10, for example, by a non-selective RIE etching process, to delineate a series of channels or grooves 38, shown in phantom in FIG. 5A, extending to an active area or element 40 in the substrate or an underlayer. In some embodiments, the channels 38 can then be filled with a material 42 as illustrated in FIG. 5B, for example, a conductive material (e.g., metal) to form nanowire channel arrays for transistor channels, semiconductor capacitors, and other structures, or a dielectric material to separate active areas (e.g., substrate 10). Further processing can then be performed as desired.

The films provide linear arrays having long range ordering and registration for a wide field of coverage for templating a substrate. The films are useful as etch masks for producing close pitched nanoscale channel and grooves that are several microns in length, for producing features such as floating gates for NAND flash with nanoscale dimensions. By comparison, photolithography techniques are unable to produce channels much below 60 nm wide without high expense. Resolution can exceed other techniques such as conventional photolithography, while fabrication costs utilizing methods of the disclosure are far less than electron beam (E-beam) or EUV photolithographies, which have comparable resolution.

A method according to another embodiment of the invention for forming thin films of a cylindrical-phase, self-assembling PS-b-PEO block copolymer that define an array of perpendicularly oriented cylinders in a polymer matrix is illustrated with reference to FIGS. 6-8. The described embodiment utilizes topographical features, the sidewalls and ends of trenches, as constraints to induce orientation and registration of cylindrical copolymer domains to achieve an array of hexagonal-packed and perpendicularly oriented cylinders within a polymer matrix registered to the trench sidewalls.

As described with reference to FIGS. 2 and 2A, a trench 16" can be etched in a material layer 14" to expose a neutral wetting surface 12" (composed of the PS-r-PEO random copolymer of the invention on an underlying substrate 10". The width ($w_t$) of the trench 16" is at or about $L_o*\cos(\pi/6)$ or $L_o*0.866$, which defines the number of rows of cylinders, and the trench length ($l_t$) is at or about $mL_o$, which defines the number of cylinders per row. The ends 24" of the trenches are angled to the sidewalls 22" as shown in FIG. 6, for example, at an about 60° angle, and in some embodiments can be slightly rounded.

The trenches are also structured such that the trench floor 18" is neutral wetting to both blocks of the PS-b-PEO block copolymer material, and the sidewalls 22" and ends 24" are preferential wetting by the minority block of the copolymer. Entropic forces drive the wetting of a neutral-wetting surface by both blocks, resulting in a perpendicular orientation of the self-assembled cylinders. As previously described, a neutral wetting layer 12" can be provided, for example, by applying the PS-r-PEO random copolymer of the invention onto the surface of the substrate 10" (e.g., spin-coating) and crosslinking the copolymer layer before forming the material layer 14" and the trenches 16" to expose the neutral wetting layer 12" forming the trench floors 18".

As previously described, sidewalls 22" and ends 24" that are preferential wetting toward the PEO block of a PS-b-PEO diblock copolymer can be provided by a material layer 14" composed, for example, of oxide. Upon annealing, the PEO block of the PS-b-PEO copolymer layer will segregate to the sidewalls and ends of the trench to form a wetting layer (30a" in FIGS. 6 and 6A).

With reference to FIGS. 3 and 3A, a layer 26" of a cylindrical-phase PS-b-PEO diblock copolymer material having an inherent pitch at or about $L_o$ (or blend with homopolymers) is deposited onto the neutral wetting PS-r-PEO random copolymer layer 12" on the floor 18" of the trench 16" to a thickness ($t_1$) of less than or about equal to the $L_o$ value of the copolymer material to up to about 1.5×$L_o$ (or larger if annealed by solvent annealing) such that the copolymer film layer will self-assemble upon annealing to form a hexagonal array of perpendicular cylindrical domains having a diameter of about 0.5 $L_o$ (e.g., about 20 nm) in the middle of a polymer matrix within each trench 16" (e.g., with the adjacent cylindrical domains 30" having a center-to-center distance of at or about $L_o$ (e.g., about 35-40 nm)).

The PS-b-PEO block copolymer film 26" is then annealed, resulting in a self-assembled lamellar film 28" as shown in FIGS. 6 and 6A. The character of the cylindrical-phase block copolymer composition 26" combined with a neutral wetting trench floor 18" and preferential wetting sidewalls 22" and ends 24", and constraints provided by the width ($w_t$) of trench 16" results, upon annealing, in a hexagonal array of perpendicularly oriented cylindrical domains 30" of the minor polymer block (i.e., like domains) (e.g., PEO) within a matrix 32" of the major polymer block (e.g., PS). A thin layer 30a" of the minor polymer block (e.g., PEO) wets the sidewalls 22". The hexagonal array contains n single rows of cylinders 30" according to the width ($W_t$) of the trench with the cylinders 30" in each row being offset from the cylinders 30" in the adjacent rows. Each row contains a number of cylinders 30", generally m cylinders, which number can vary according to the length ($l_t$) of the trench 16" and the shape of the trench end (e.g., rounded, angled, etc.) with some rows having greater or less than m cylinders. The cylinders 30" are generally spaced apart at a pitch distance ($p_1$) at or about $L_o$ between each cylinder in the same row and an adjacent row (center-to-center distance), and at a pitch distance ($p_2$) at or about $L_o*\cos(\pi/6)$ or 0.866 $L_o$ being the distance between two parallel lines where one line bisects the cylinders in a given row and the other line bisects the cylinders in an adjacent row.

Optionally, the annealed film 28" can then treated to crosslink the polymer segments (e.g., to crosslink the PS matrix 32"). As previously described, the polymers can be structured to inherently crosslink, or one or both of the polymer blocks of the copolymer material can be formulated to contain a crosslinking agent. The polymer material remaining on the spacers 20" can then be optionally removed as previously described.

One of the block components can then be selectively removed from the self-assembled 28" film. In one embodiment shown in FIGS. 7 and 7A, the cylindrical domains 30" can be removed to produce a film 34a" composed of the matrix 32" with a hexagonal array of cylindrical openings 36". In another embodiment shown in FIGS. 8-8B, the matrix 32" can be removed to produce a film 34b" composed of a hexagonal array of cylinders 30" on the substrate 10". The resulting films 34a", 34b" can be used, for example, as a lithographic template or mask to pattern the underlying substrate 10" in a semiconductor processing to define regular patterns in the nanometer size range (i.e., about 5-50 nm).

Figure 7B:
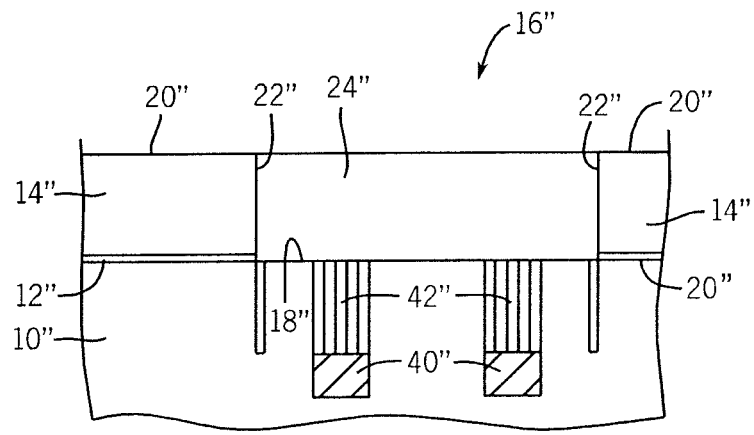
FIGS. 7B and 8B are views of FIGS. 7A and 8A, respectively, in a subsequent processing stage.

For example, referring to FIGS. 7 and 7A, selective removal of the minor block cylinders 30" (e.g., PEO) will result in a film 34a" composed of a hexagonal array of openings 36" within the matrix 32" of the major block (e.g., PS), the openings having a diameter of about 5-50 nm and an aspect ratio generally at least about 1:2 and ranging from about 1:2 to about 1:20. The film 34a" can be used as an etch mask to pattern (arrows 11) the underlying substrate 10" to form an array of openings 38" (shown in phantom in FIG. 7A) to an active area or element 40" in the substrate 10". Further processing can then be performed as desired, for example, the removal of the residual matrix 32" (e.g., PS) and filling of the openings 38" in substrate 10" as shown in FIG. 7B, with a material 42" such as a metal or conductive alloy such as Cu, Al, W, Si, and $Ti_3N_4$, among others, to form contacts, for example, to an underlying active area or conductive line 40", or with a metal-insulator-metal stack to form capacitors with an insulating material such as $SiO_2$, $Al_2O_3$, $HfO_2$, $ZrO_2$, $SrTiO_3$, among other dielectrics.

Figure 8B:
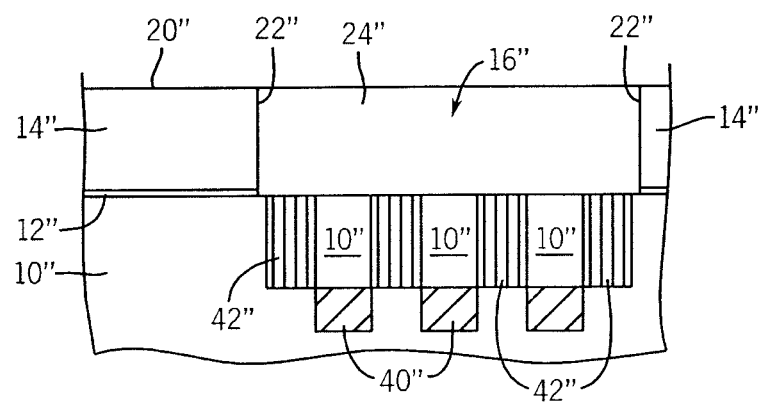

In another embodiment illustrated in FIGS. 8 and 8A, the selective removal of the major block matrix 32" (e.g., PEO) will provide a film 34b" composed of a hexagonal array of the minor block cylinders 30" (e.g., PS) on the substrate 10". Such an embodiment would require a majority PEO block copolymer and sidewalls composed of a material that is selectively PS-wetting (e.g., a gold sidewall or PS-grafted to the sidewall material). The film 34b" composed of cylinders 30" can be used as an etch mask (arrows ↓↓) to etch a patterned opening 38" in the underlying substrate 10" (shown in phantom in FIG. 8A) with the substrate 10" etched to form cylinders masked by the cylindrical domains 30" of the film 34b". Further processing can then be conducted, for example, the removal of the residual polymer film 34b" (i.e., cylinders 30") and the deposition of a material 42" distinct from substrate 10" into the opening 36" to provide a differential surface, as illustrated in FIG. 8B. For example, an opening 36" in a silicon substrate 10" can be filled with a dielectric material such as $SiO_2$, with the cylinders of the residual substrate 10" (e.g., of silicon) providing contacts to an underlying active area or metal lines 40".

Figure 9:
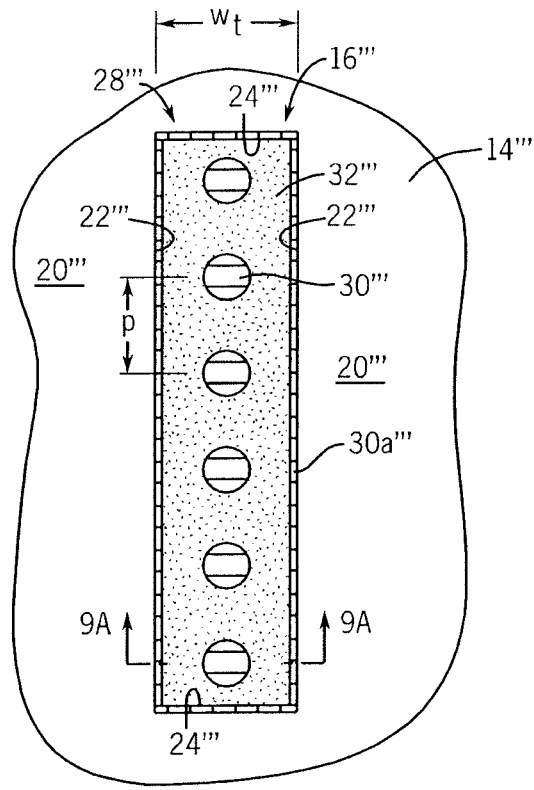
FIG. 9 illustrates a diagrammatic top plan view of a portion of a substrate at a processing stage according to another embodiment of the present disclosure in the fabrication of a self-assembled block copolymer film utilizing a cylindrical-phase block copolymer.
Figure 10:
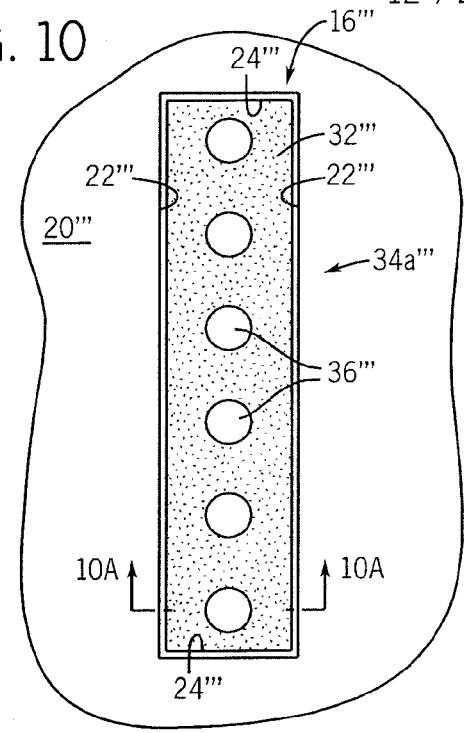

In an embodiment of a method to produce a one-dimensional (1-D) array of perpendicularly oriented cylinders as illustrated in FIGS. 9-11, the foregoing process for forming a hexagonal array of cylinders with a cylindrical-phase PS-b-PEO block copolymer can be modified by utilizing the trench sidewalls and ends as constraints to induce orientation and registration of cylindrical copolymer domains in a single row parallel to the trench sidewalls.

Figure 9A:
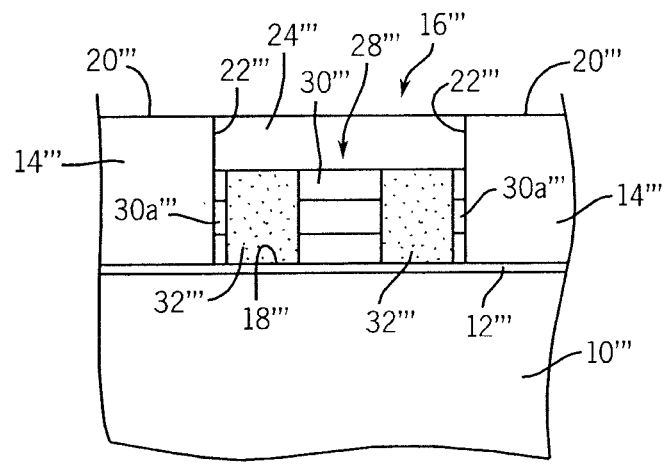
FIG. 9A is an elevational, cross-sectional view of the substrate depicted in FIG. 9 taken along line 9A-9A.

Referring to FIGS. 9 and 9A, in embodiments to provide a single row of cylinders within a polymer matrix, a trench 16''' is structured to have a width ($w_t$) that is at or about 1.5-1.75*the $L_o$ value of the block copolymer material. The material layer 14''' (e.g., oxide) exposed on the sidewalls 22''' and ends 24''' is preferential wetting by the minority block (e.g., the PEO block) of the PS-b-PEO diblock copolymer, and the substrate 10''' (e.g., silicon) bears a layer 12''' of the PS-r-PEO random copolymer of the invention, which is exposed at the trench floors 18''' and neutral wetting to both blocks of the PS-b-PEO copolymer material.

A cylindrical-phase PS-b-PEO diblock copolymer material 26''' (or blend with homopolymers) having an inherent pitch at or about $L_o$ can be deposited onto the PS-r-PEO layer 12''' on the trench floor 18''' to a thickness ($t_1$) of less than or about equal to the $L_o$ value of the copolymer material to up to about 1.5×$L_o$ (as shown in FIGS. 3 and 3A). The diblock copolymer material 26''' is then annealed, whereupon the copolymer film layer will self-assemble to form a film 28''', as illustrated in FIGS. 9 and 9A. The constraints provided by the width ($w_t$) of trench 16''' and the character of the block copolymer composition 26''' combined with a neutral wetting trench floor 18''' and preferential wetting sidewalls 22''' and ends 24''' results in a one-dimensional (1-D) array or single row of perpendicularly oriented cylindrical domains 30''' of the minority polymer block (e.g., PEO) within a matrix 32''' of the major polymer block (e.g., PS), with the minority block segregating to the sidewalls 22''' of the trench to form a wetting layer 30a'''. In some embodiments, the cylinders have a diameter at or about 0.5 $L_o$ (e.g., about 20 nm), the number n of cylinders in the row is according to the length of the trench, and the center-to-center distance (pitch distance) (p) between each like domain (cylinder) is at or about $L_o$ (e.g., about 40 nm). Optionally, the annealed cylindrical-phase film 28''' can be treated to crosslink the polymer segments (e.g., the PS matrix 32''').

Figure 10A:
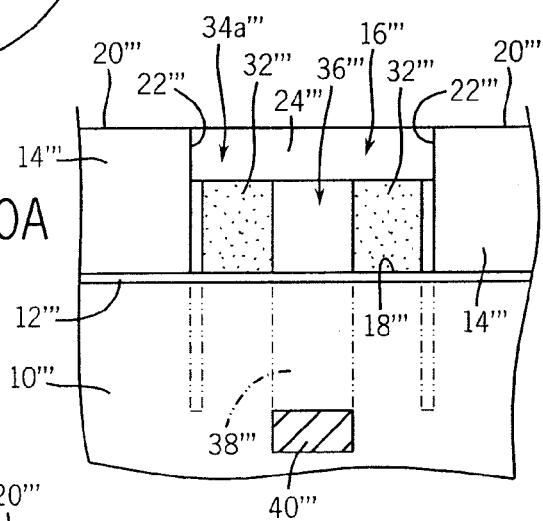
Figure 10B:
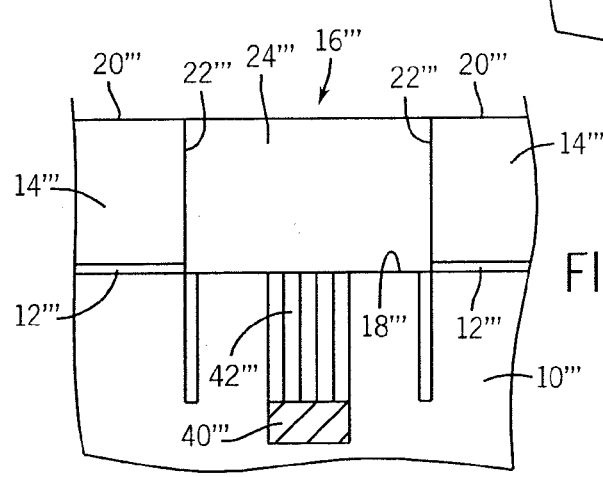

Selective removal of one of the block components can then be performed to produce, for example, a film that can be used as a mask to etch the underlying substrate 10'''. For example, referring to FIGS. 10 and 10A, selective removal of the minor block cylinders 30''' (e.g., PEO) will result in a film 34a''' composed of a 1-D array of cylindrical openings 36''' within the matrix 32''' of the major block (e.g., PS), the openings having a diameter of about 5-50 nm and an aspect ratio of about 1:2 to about 1:20. The film 34a''' can be used as an etch mask to pattern (arrows ↓↓) the underlying substrate 10''' to form an array of openings 38''' (shown in phantom in FIG. 10A) extending to an active area or element 40'''. The residual film 34a''' can then be removed and the openings 38''' in the substrate 10''' can be filled as shown in FIG. 10B with a material 42''', for example, a metal or conductive alloy to provide a 1-D array of contacts to an underlying active area or line contact 40''', for example, or with metal-insulator-metal stack to form capacitors.

In another embodiment depicted in FIGS. 11-11B, the selective removal of the major block matrix component 32''' (e.g., PEO) will provide a film 34b''' composed of a 1-D array of the minor block cylinders 30''' (e.g., PS). The film 34b''' can be used as a mask or template in an etch process (arrows ↓↓) to form a patterned opening 38''' (shown in phantom in FIG. 11A) in the underlying substrate 10''', with the masked substrate 10''' etched to form cylinders. The residual polymer mask 34b''' (cylinders 30''') can then be removed and a material 42''' such as a dielectric material (e.g., oxide) that is distinct from the substrate 10''' (e.g., silicon) can be deposited to fill the opening 36'' to provide a differential surface to the substrate 10'' cylinders, which can provide contacts to an underlying active area or metal line 40''', for example.

Figure 12:
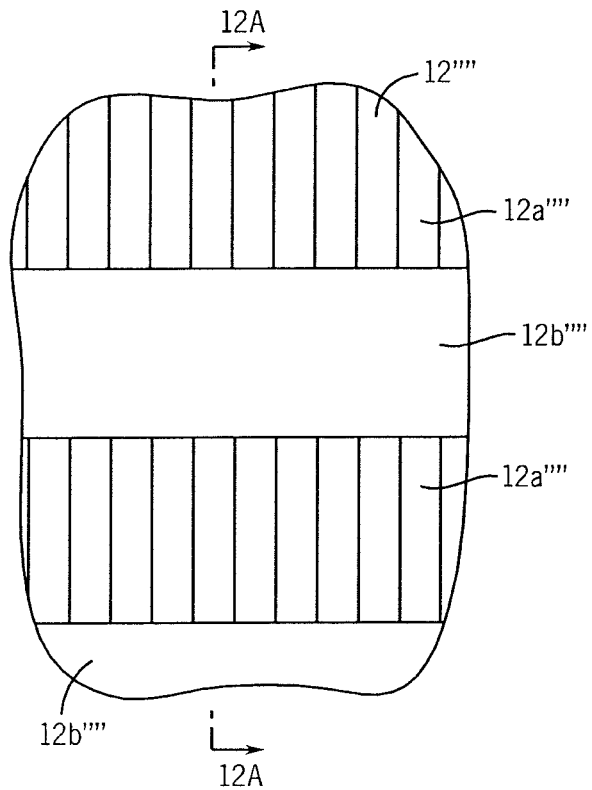
FIG. 12 illustrates a diagrammatic top plan view of a portion of a substrate at a preliminary processing stage according to another embodiment of the disclosure, showing patterning of the neutral wetting layer.
Figure 12A:
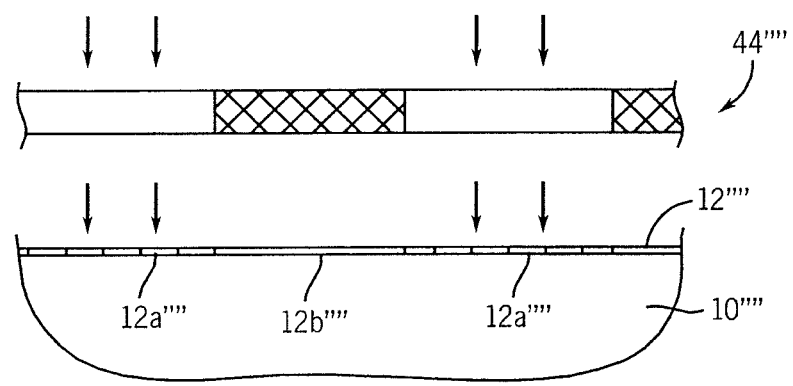
FIG. 12A is an elevational, cross-sectional view of the substrate depicted in FIG. 12 taken along line 12A-12A.
Figure 13:
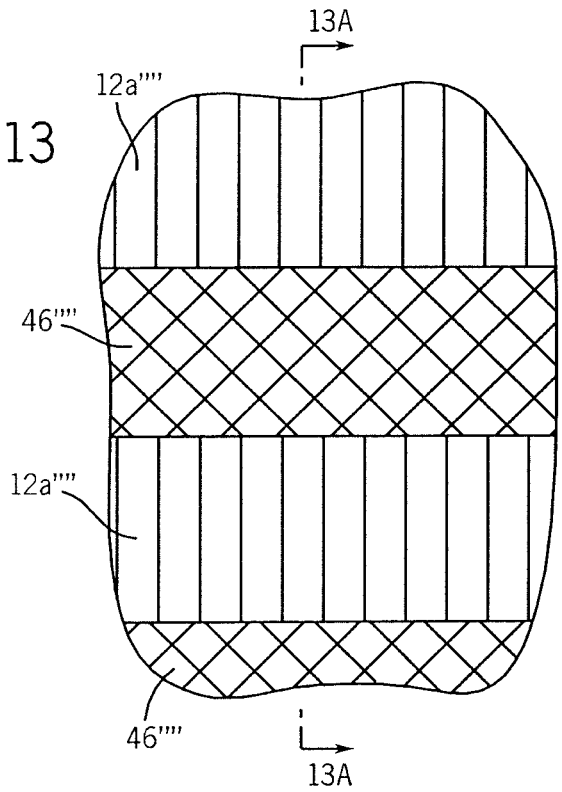
Figure 13A:
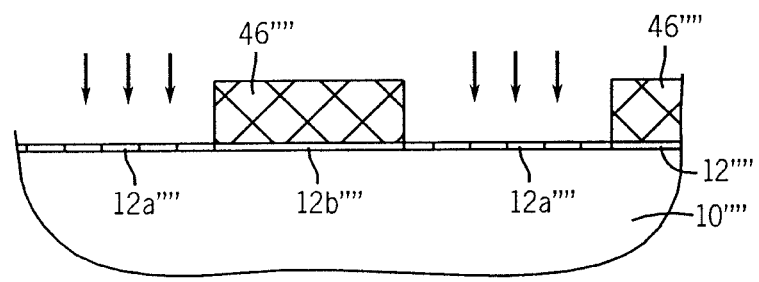
Figure 14:
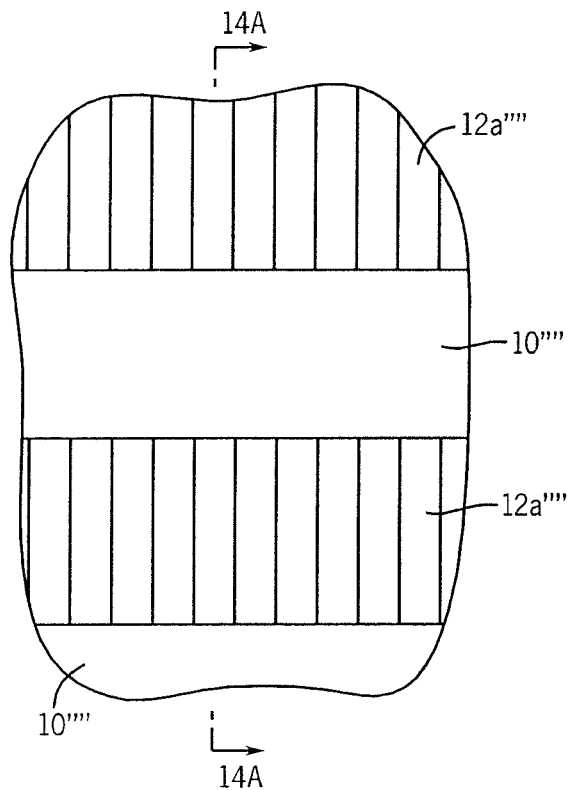
Figure 14A:
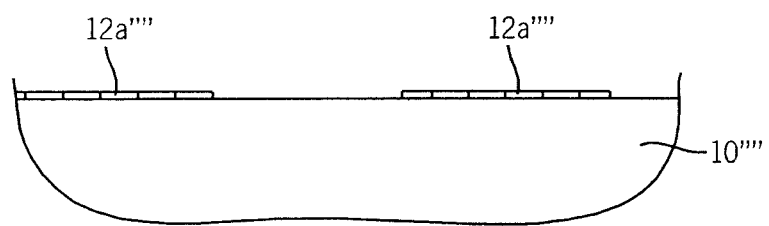

In another embodiment of the invention, graphoepitaxy (topographic features, e.g., sidewalls, ends, etc.) is used to influence the formation of arrays in one dimension, and the trench floors provide a wetting pattern that can be used to chemically control formation of the arrays in a second dimension. A layer 12'''' of the PS-r-PEO random copolymer layer of the invention is formed on a substrate 10'''', and crosslinked in select regions or sections 12a'''', for example, by photo-exposure (arrows ↓↓) through a reticle or a mask 44'''' as shown in FIGS. 12 and 12A, or through a patterned resist layer 46'''' as depicted in FIGS. 13 and 13A (which is subsequently removed). The non-crosslinked regions 12b'''' of the PS-r-PEO random copolymer layer 12'''' can be removed, for example, by wet processing using an appropriate solvent to expose the underlying substrate 10'''', resulting in a pattern of discrete regions or sections of the crosslinked random copolymer layer 12a'''' (neutral wetting) and sections of the exposed substrate 10'''' (preferential wetting) on the trench floor 18'''', as shown in FIGS. 14 and 14A.

Figure 15:
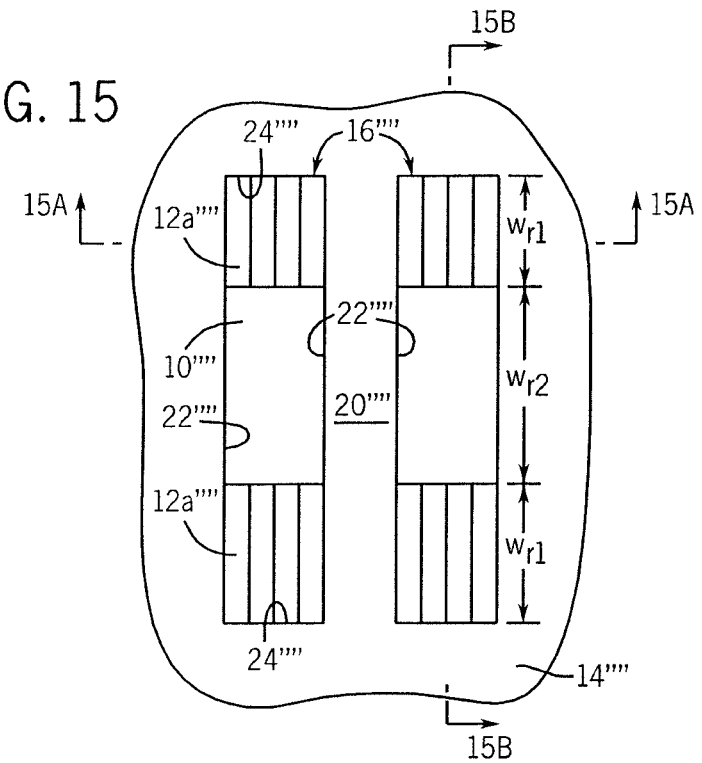
Figure 15A:
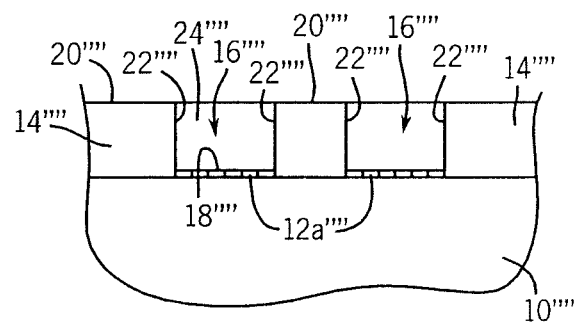
Figure 15B:
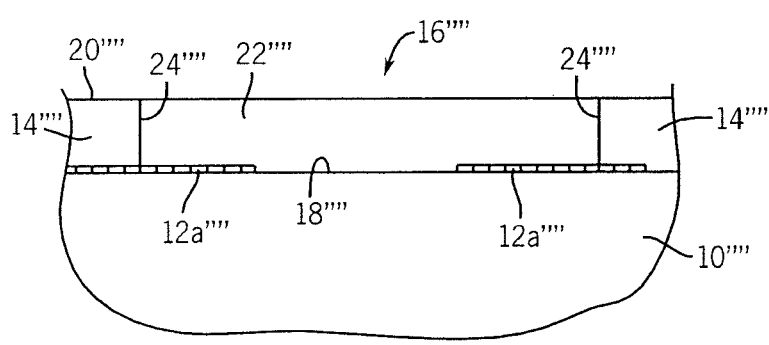

As depicted in FIGS. 15-15B, a material layer 14'''' can then be formed and trenches 16'''' etched to expose the crosslinked sections 12a'''' of the PS-r-PEO random copolymer layer and sections of the exposed substrate 10'''' on the trench floors 18'''' as a series of stripes oriented perpendicular to the trench sidewalls 22''''. The trench floors 18'''' are thus defined by alternating preferential wetting sections (substrate 10'''') and neutral wetting sections (a mat of the crosslinked PS-r-PEO random copolymer 12a''''). In some embodiments, each of the sections can have a width ($w_{r1}$) at or about $L_o$, and in other embodiments, the neutral wetting (PS-r-PEO) sections 12a'''' can have a width ($w_{r2}$) at or about $nL_o$ and the preferential wetting (substrate 10'''') a width at or about $L_o$. The trench sidewalls 22'''' and edges 24'''' (e.g., of oxide) are preferential wetting to the minority block (e.g., PEO) of the PS-b-PEO diblock copolymer.

Figure 16:
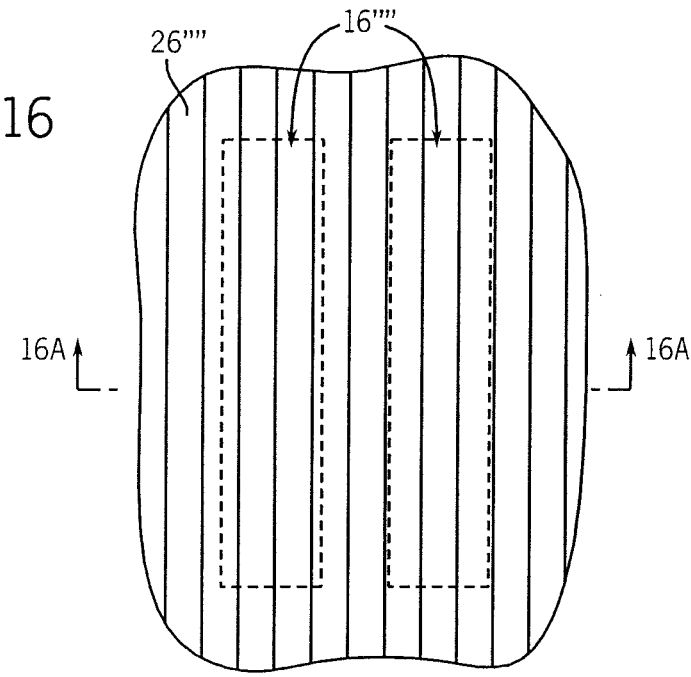
Figure 16A:
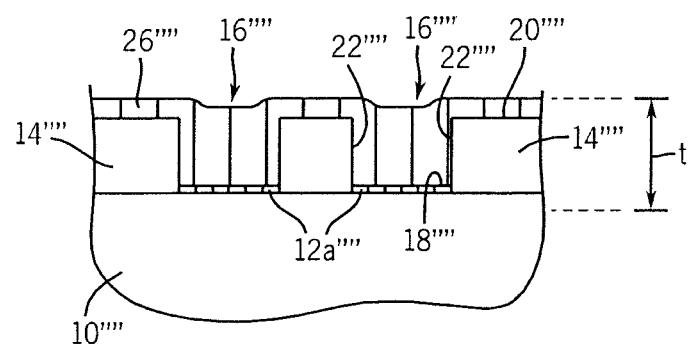
Figure 17:
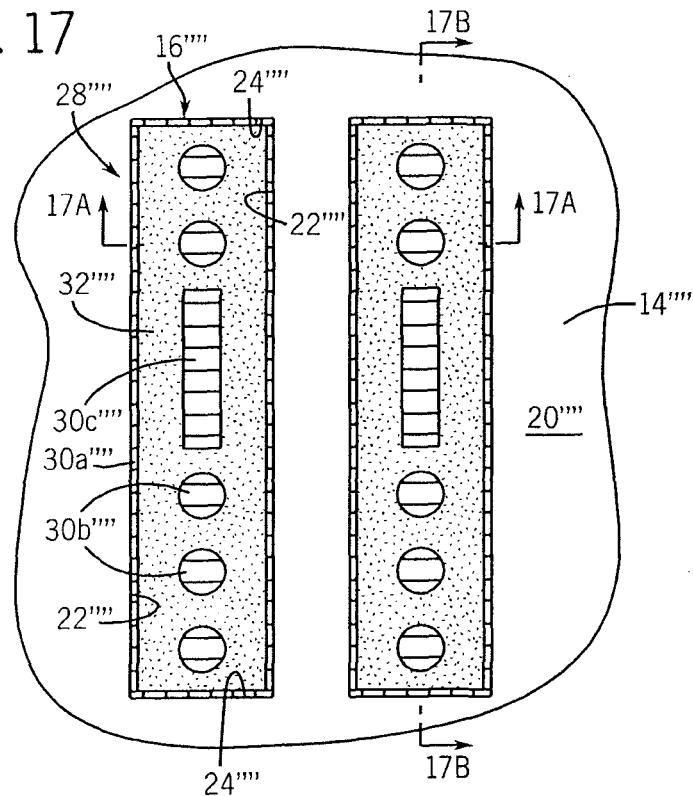
Figure 17A:
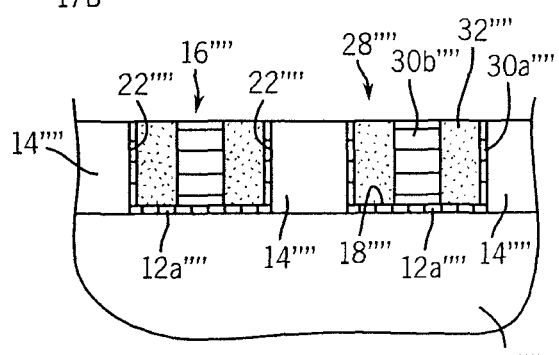
Figure 17B:
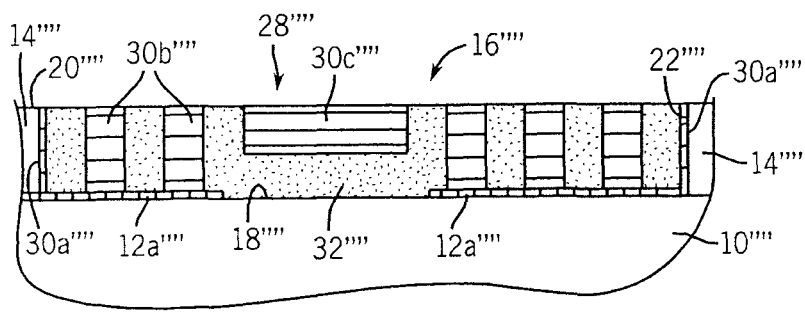

Referring now to FIGS. 16 and 16A, a cylindrical-phase PS-b-PEO block copolymer film 26'''' (e.g., having a pitch $L_o$) is cast or spin coated into the trenches 16'''' to a film thickness (t) of about $L_o$, and then thermally annealed as previously described. The differing wetting patterns on the trench floor 18'''' imposes ordering on the PS-b-PEO block copolymer film 26'''' as it is annealed, resulting in a 1-D array of alternating perpendicular-oriented cylinders 30b'''' and parallel-oriented cylinders 30c'''' for the length ($nL_o$) of each trench 16'''', as shown in FIGS. 17-17B. In some embodiments, the film structure is composed of a series of n perpendicular cylinders 30b'''' for the width ($w_1$) of each neutral wetting PS-r-PEO polymer section 12a'''' on either side of a region of a single parallel-oriented half-cylinder 30c'''' for the width ($w_2$) of each preferential wetting section (exposed substrate 10'''').

Optionally, the annealed film 28'''' can then be treated to crosslink the polymer segments (e.g., the PS matrix 32'''') as previously described. Material outside the trenches can be optionally removed, for example, from the spacers 20''''.

Selective removal of one of the polymer domains (i.e., cylinders or matrix) can then be performed to produce a template for use in patterning the substrate 10''''. For example, as shown in FIGS. 18-18B, selective removal of the cylindrical domains 30b'''', 30c'''' (e.g., of PEO) will produce an array of openings 36a'''', 36b'''' within a polymer matrix 32'''' (e.g., of PS), which will vary according to the orientation of the cylindrical domains within the trenches. Only openings 36a'''' will extend to the trench floor 18'''', with majority block matrix component 32'''' (e.g., PS) remaining underneath the half-cylinder openings 36b''''.

Figure 19A:
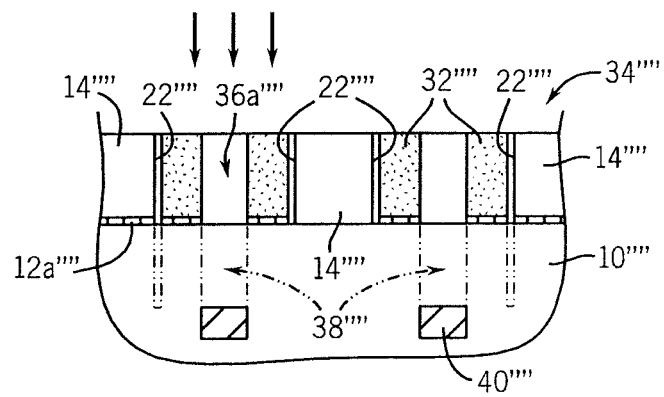
FIGS. 19A and 19B are cross-sectional views of the substrate depicted in FIGS. 18A and 18B, at a subsequent processing step according to an embodiment of the invention.
Figure 19B:
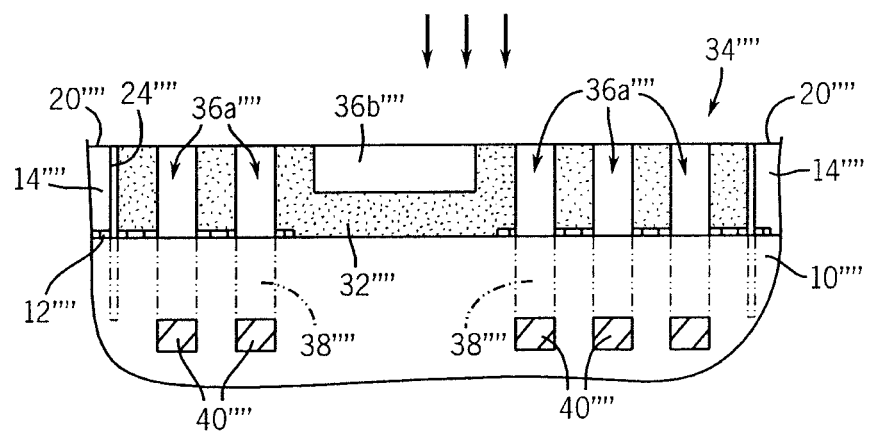
Figure 20:
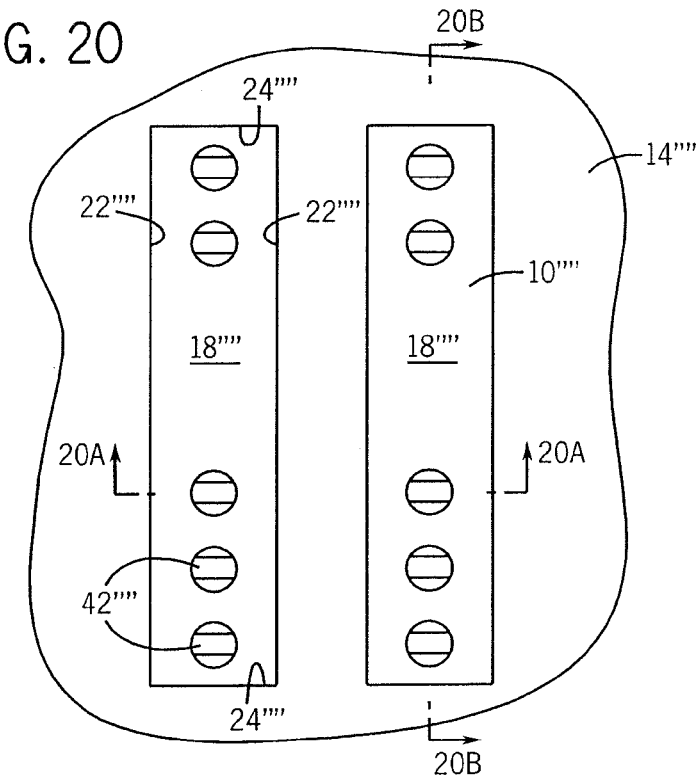
FIG. 20 is a top plan view of the substrate of FIGS. 19A and 19B in a subsequent processing step.
Figure 20A:
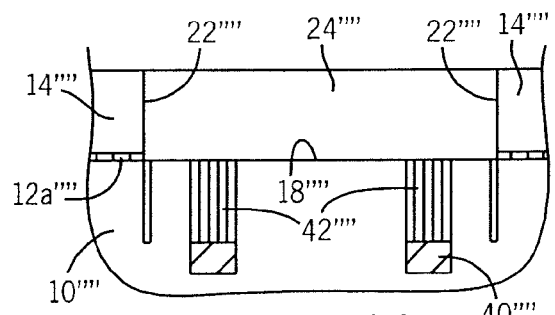
FIGS. 20A and 20B are cross-sectional views of the substrate illustrated in FIG. 20, taken along lines 20A-20A and 20B-20B, respectively.
Figure 20B:
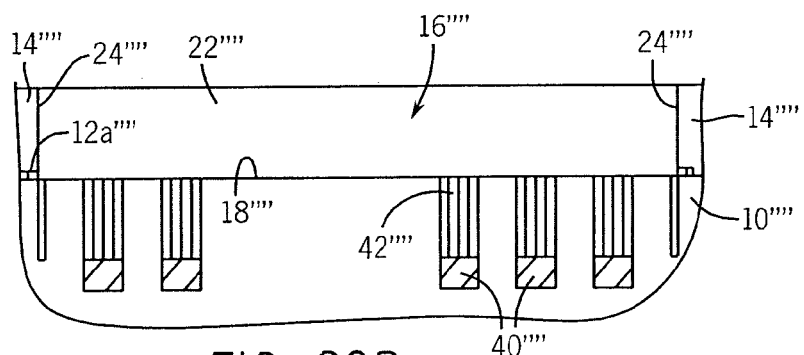

As shown in FIGS. 19A and 19B, the resulting film 34'''' can be then used in patterning (arrows ↓↓) substrate 10'''' to form a configuration of cylindrical openings 38'''' (shown in phantom) extending to an active area or element 40''''. The film 34'''' can then be removed and the openings 38'''' can be filled with a material 42'''' (e.g., metal, conductive alloy) as shown in FIGS. 20-20B to provide a series of perpendicular contacts 42'''' to underlying active areas or elements (e.g., line contact) 40'''', with additional processing as desired.

In yet another embodiment illustrated in FIGS. 21-21B, selective removal of the major block matrix component 32'''' (e.g., PEO) will provide a film 34'''' composed of an array of the minor block cylinders 30b'''' (e.g., PS) on the substrate 10'''', which can be used to etch (arrows ↓↓) openings 38'''' in substrate 10'''' (shown in phantom), with the masked portions of the substrate 10'''' etched in the form of cylinders. The residual mask 34'''' (cylinders 30'''') can be removed and, as shown in FIGS. 22-22B, a material 42'''' distinct from the substrate 10'''' (e.g., silicon) such as a dielectric material (e.g., oxide) can be deposited to fill the opening 36'' as a differential material than the substrate 10'''' cylinders, which can provide, for example, contacts to an underlying active area or metal line 40''''.

Embodiments of the invention provide ordered and registered elements on a nanometer scale that can be prepared more inexpensively than by electron beam lithography or EUV photolithography. The feature sizes produced and accessible by this invention cannot be prepared by conventional photolithography.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A method of forming a self-assembled block copolymer structure, comprising:
    preparing an azido-functionalized random poly(styrene-r-ethylene oxide) graft copolymer by:
        reacting a reaction mixture comprising p-chloromethylstyrene and styrene to form polymer chains comprising chloromethyl moieties and repeating units derived from p-chloromethylstyrene and styrene, wherein the reaction mixture comprises p-chloromethylstyrene in a molecular amount greater than a molecular amount of the styrene;
        reacting the polymer chains with one or more oligomers or polymers of poly(ethylene oxide) to form a graft copolymer comprising chloromethyl moieties, wherein the poly(ethylene oxide) has only one nucleophilic end; and
        reacting the graft copolymer comprising chloromethyl moieties with an azide compound to displace chlorine atoms of the chloromethyl moieties to form azidomethyl moieties on the graft copolymer;
    forming the azido-functionalized random poly(styrene-r-ethylene oxide) graft copolymer over at least a portion of a floor of a trench in a substrate to provide a trench having at least one portion of the floor bearing azido-functionalized random poly(styrene-r-ethylene oxide) graft copolymer and at least one portion of the floor exposing the substrate;
    forming a block copolymer material within the trench in the substrate; and
    annealing the block copolymer material to self-assemble the block copolymer material into first and second self-assembled domains of a first polymer block of the block copolymer material in a matrix of a second polymer block, the first self-assembled domains over the at least a portion of the floor of the trench bearing a crosslinked material of the azido-functionalized random poly(styrene-r-ethylene oxide) graft copolymer, the first self-assembled domains oriented perpendicular to the at least a portion of the floor of the trench bearing the crosslinked material of the azido-functionalized random poly(styrene-r-ethylene oxide) graft copolymer and parallel to sidewalk of the trench, the second self-assembled domains over the at least a portion of the floor of the trench exposing the substrate, the second self-assembled domains oriented parallel to the floor and sidewalls of the trench.

2. A method of forming a self-assembled block copolymer structure, comprising:
    preparing an azido-functionalized random poly(styrene-r-ethylene oxide) graft copolymer by:
        reacting a reaction mixture comprising p-chloromethylstyrene to form a p-chloromethylstyrene homopolymer comprising chloromethyl moieties and repeating units derived from p-chloromethylstyrene;
        reacting the p-chloromethylstyrene homopolymer with one or more oligomers or polymers of poly(ethylene oxide) to form a graft copolymer comprising chloromethyl moieties, wherein the poly(ethylene oxide) has only one nucleophilic end; and
        reacting the graft copolymer comprising chloromethyl moieties with an azide compound to displace chlorine atoms of the chloromethyl moieties to form azidomethyl moieties on the graft copolymer;
    forming the azido-functionalized random poly(styrene-r-ethylene oxide) graft copolymer over at least a portion of a floor of a trench in a substrate to provide a trench having at least one portion of the floor bearing azido-functionalized random poly(styrene-r-ethylene oxide) graft copolymer and at least one portion of the floor exposing the substrate;
    forming a block copolymer material within the trench in the substrate; and
    annealing the block copolymer material to self-assemble the block copolymer material into first and second self-assembled domains of a first polymer block of the block copolymer material in a matrix of a second polymer block, the first self-assembled domains over the at least a portion of the floor of the trench bearing a crosslinked material of the azido-functionalized random poly(styrene-r-ethylene oxide) graft copolymer, the first self-assembled domains oriented perpendicular to the at least a portion of the floor of the trench bearing the crosslinked material of the azido-functionalized random poly(styrene-r-ethylene oxide) graft copolymer and parallel to sidewalls of the trench the second self-assembled domains over the at least a portion of the floor of the trench exposing the substrate, the second self-assembled domains oriented parallel to the floor and sidewalls of the trench.

3. The method of claim 1, wherein annealing the block copolymer material to self-assemble the block copolymer material comprises:
    forming lamella domains over the at least a portion of the floor of the trench bearing the crosslinked material of the azido-functionalized random poly(styrene-r-ethylene oxide) graft copolymer, the lamella domains oriented perpendicular to the at least a portion of the floor of the trench bearing the crosslinked material of the azido-functionalized random poly(styrene-r-ethylene oxide) graft copolymer and parallel to the sidewalls; and
    forming half-cylindrical domains over the at least a portion of the floor of the trench exposing the substrate, the half-cylindrical domains oriented parallel to the floor and sidewalls of the trench.

4. The method of claim 1, wherein annealing the block copolymer material to self-assemble the block copolymer material comprises:
    forming cylindrical domains over the at least a portion of the floor of the trench bearing the crosslinked material of the azido-functionalized random poly(styrene-r-ethylene oxide) graft copolymer, the cylindrical domains oriented perpendicular to the at least a portion of the floor of the trench bearing the crosslinked material of the azido-functionalized random poly(styrene-r-ethylene oxide) graft copolymer and parallel to the sidewalls; and
    forming half-cylindrical domains over the at least a portion of the floor of the trench exposing the substrate, the half-cylindrical domains oriented parallel to the floor and sidewalls of the trench.

5. The method of claim 4, wherein forming cylindrical domains over the at least a portion of the floor of the trench bearing the crosslinked material of the azido-functionalized random poly(styrene-r-ethylene oxide) graft copolymer comprises forming cylindrical domains in a hexagonal array perpendicular to the floor of the trench and parallel to the sidewalls.

6. The method of claim 4, wherein forming cylindrical domains over the at least a portion of the floor of the trench bearing the crosslinked material of the azido-functionalized random poly(styrene-r-ethylene oxide) graft copolymer comprises forming cylindrical domains in a single array perpendicular to the floor of the trench and parallel to the sidewalls.

7. The method of claim 1, further comprising selectively removing the second polymer block of the block copolymer material to provide a self-assembled structure within the trench, the self-assembled structure comprising a plurality of linear openings exposing the substrate and separated by lamellar domains of the first polymer block, the lamellar domains of the first polymer block supported by the at least a portion of the floor of the trench bearing the crosslinked material of the azido-functionalized random poly(styrene-r-ethylene oxide) graft copolymer.

8. The method of claim 1, further comprising selectively removing the first polymer block of the block copolymer material to provide a self-assembled structure within the trench, the self-assembled structure comprising a plurality of linear openings exposing the substrate and separated by lamellar domains of the second polymer block, the lamellar domains of the second polymer block supported by the at least a portion of the floor of the trench bearing the crosslinked material of the azido-functionalized random poly(styrene-r-ethylene oxide) graft copolymer.

9. The method of claim 1, further comprising selectively removing the second polymer block of the block copolymer material to provide a self-assembled structure within the trench, the self-assembled structure comprising a plurality of cylinders of the first polymer block supported by the at least a portion of the floor of the trench bearing the crosslinked material of the azido-functionalized random poly(styrene-r-ethylene oxide) graft copolymer, the plurality of cylinders arranged in a hexagonal array at a pitch distance of about $L_o$ of the block copolymer material, the plurality of cylinders oriented perpendicular to the floor of the trench.

10. The method of claim 1, further comprising selectively removing the second polymer block of the block copolymer material to provide a self-assembled structure within the trench, the self-assembled structure comprising a plurality of cylinders of the first polymer block supported by the at least a portion of the floor of the trench bearing the crosslinked material of the azido-functionalized random poly(styrene-r-ethylene oxide) graft copolymer, the plurality of cylinders arranged in a single array at a pitch distance of about $L_o$ of the block copolymer material, the plurality of cylinders oriented perpendicular to the floor of the trench.

11. The method of claim 1, further comprising selectively removing the first polymer block of the block copolymer material to provide a self-assembled structure within the trench, the self-assembled structure comprising a plurality of cylindrical openings in a hexagonal array within the matrix of the second polymer block, the plurality of cylindrical openings exposing the floor of the trench and oriented perpendicular to the floor of the trench.

12. The method of claim 1, further comprising selectively removing the first polymer block of the block copolymer material to provide a self-assembled structure within the trench, the self-assembled structure comprising a plurality of cylindrical openings in a single array within the matrix of the second polymer block, the plurality of cylindrical openings exposing the floor of the trench and oriented perpendicular to the floor of the trench.

13. A self-assembled block copolymer structure within a trench in a substrate, the self-assembled block copolymer structure comprising:
first self-assembled domains of a block copolymer material over a crosslinked material of an azido-functionalized random poly(styrene-r-ethylene oxide) graft copolymer on at least a portion of a floor of the trench, the first self-assembled domains oriented perpendicular to the floor of the trench, the first self-assembled domains comprising a plurality of lamellar polymer domains at a pitch distance of about $L_o$ of the block copolymer material and separated by linear openings exposing the floor of the trench.

14. The self-assembled block copolymer structure of claim 13, further comprising:
second self-assembled domains of the block copolymer material over at least a portion of the floor of the trench exposing the substrate, the second self-assembled domains comprising half-cylindrical domains oriented parallel to the sidewalls and the floor of the trench.

15. A self-assembled block copolymer structure within a trench in a substrate, the self-assembled block copolymer structure comprising:
first self-assembled domains of a block copolymer material over a crosslinked material of an azido-functionalized random poly(styrene-r-ethylene oxide) graft copolymer on at least a portion of a floor of the trench, the first self-assembled domains oriented perpendicular to the floor of the trench and comprising a plurality of cylinders in a hexagonal array at a pitch distance of about $L_o$ of the block copolymer material, the floor of the trench exposed between the self-assembled domains.

16. The self-assembled block copolymer structure of claim 15, further comprising:
second self-assembled domains of the block copolymer material over at least a portion of the floor of the trench exposing the substrate, the second self-assembled domains comprising half-cylindrical domains oriented parallel to the substrate and the sidewalls.

17. A self-assembled block copolymer structure within a trench in a substrate, the self-assembled block copolymer structure comprising:
first self-assembled domains of a block copolymer material over a crosslinked material of an azido-functionalized poly(styrene-r-ethylene oxide) graft copolymer on at least a portion of a floor of the trench, the first self-assembled domains oriented perpendicular to the floor of the trench and comprising a plurality of cylinders in a single array at a pitch distance of about $L_o$ of the block copolymer material, the floor of the trench exposed between the self-assembled domains.

18. The self-assembled block copolymer structure of claim 17, further comprising:
second self-assembled domains of the block copolymer material over at least a portion of the floor of the trench exposing the substrate, the second self-assembled domains comprising half-cylindrical domains oriented parallel to the substrate and the sidewalls.

19. The self-assembled block copolymer structure of claim 13, wherein the block copolymer material comprises poly(styrene-b-ethylene oxide) block copolymer.

20. The self-assembled block copolymer structure of claim 13, wherein the linear openings are about 5 nm to 60 nm wide.

* * * * *

UNITED STATES PATENT AND TRADEMARK OFFICE
CERTIFICATE OF CORRECTION

PATENT NO.       : 8,785,559 B2
APPLICATION NO.  : 13/934676
DATED            : July 22, 2014
INVENTOR(S)      : Millward Page 1 of 1

It is certified that error appears in the above-identified patent and that said Letters Patent is hereby corrected as shown below:

In the Claims

Column 17, line 48, Claim 1, delete "sidewalk" and insert -- sidewalls --, therefor.

Column 18, line 24, Claim 2, delete "trench" and insert -- trench, --, therefor.

Column 20, line 43, Claim 17, after "azido-functionalized" insert -- random --.

Signed and Sealed this
Thirtieth Day of September, 2014

Michelle K. Lee
*Deputy Director of the United States Patent and Trademark Office*